US012635241B2

(12) United States Patent
Xie et al.

(10) Patent No.: US 12,635,241 B2
(45) Date of Patent: May 19, 2026

(54) FORK SHEET WITH REDUCED COUPLING EFFECT

(71) Applicant: International Business Machines Corporation, Armonk, NY (US)

(72) Inventors: Ruilong Xie, Niskayuna, NY (US); Chun-Chen Yeh, Danbury, CT (US); Heng Wu, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 714 days.

(21) Appl. No.: 17/541,529

(22) Filed: Dec. 3, 2021

(65) Prior Publication Data

US 2023/0178559 A1    Jun. 8, 2023

(51) Int. Cl.
| | |
|---|---|
| *H10D 86/60* | (2025.01) |
| *H10D 30/67* | (2025.01) |
| *H10D 84/01* | (2026.01) |
| *H10D 84/03* | (2025.01) |
| *H10D 84/85* | (2025.01) |
| *H10D 86/01* | (2026.01) |
| *H10D 86/40* | (2025.01) |

(52) U.S. Cl.
CPC ......... *H10D 86/60* (2025.01); *H10D 30/6735* (2025.01); *H10D 84/0188* (2025.01); *H10D 84/038* (2025.01); *H10D 84/85* (2025.01); *H10D 86/0212* (2025.01); *H10D 86/421* (2025.01)

(58) Field of Classification Search
CPC ............. H10D 30/014; H10D 30/6757; H10D 62/121; B82Y 10/00
See application file for complete search history.

(56) References Cited

U.S. PATENT DOCUMENTS

| | | |
|---|---|---|
| 8,637,384 B2 | 1/2014 | Ando et al. |
| 9,362,303 B2 | 6/2016 | Lee et al. |
| 9,614,056 B2 | 4/2017 | Xie et al. |

(Continued)

FOREIGN PATENT DOCUMENTS

| | | |
|---|---|---|
| EP | 3654372 B1 | 4/2021 |
| TW | 202008436 A | 2/2020 |

(Continued)

OTHER PUBLICATIONS

International Search Report and Written Opinion for PCT/EP2022/080825 dated Feb. 14, 2023 (16 pages).
(Continued)

*Primary Examiner* — William B Partridge
*Assistant Examiner* — Felix B Andrews
(74) *Attorney, Agent, or Firm* — Monchai Chuaychoo

(57) ABSTRACT

Fork sheet FET devices with airgap isolation are provided. In one aspect, a fork sheet FET device includes: at least a first nanosheet FET and a second nanosheet FET; and a dielectric pillar disposed directly between the first nanosheet FET and the second nanosheet FET, wherein the dielectric pillar includes an airgap. For instance, the first nanosheet FET and the second nanosheet FET can have nanosheets that extend horizontally on opposite sides of the dielectric pillar. A method of forming a fork sheet FET device having airgap isolation is also provided.

11 Claims, 20 Drawing Sheets

Y1-Y1′

(56) References Cited

U.S. PATENT DOCUMENTS

| | | | | |
|---|---|---|---|---|
| 10,224,396 | B1 * | 3/2019 | Shank | H10D 62/115 |
| 10,361,202 | B2 | 7/2019 | Suh et al. | |
| 10,566,248 | B1 | 2/2020 | Chanemougame et al. | |
| 10,903,315 | B2 | 1/2021 | Loubet et al. | |
| 2019/0139831 | A1 | 5/2019 | Zhu | |
| 2019/0229184 | A1 * | 7/2019 | Shank | H10D 62/151 |
| 2019/0259772 | A1 | 8/2019 | Takahashi et al. | |
| 2020/0035567 | A1 | 1/2020 | Chanemougame et al. | |
| 2020/0035786 | A1 | 1/2020 | Xie et al. | |
| 2020/0066725 | A1 | 2/2020 | Bhuwalka et al. | |
| 2020/0119180 | A1 | 4/2020 | Frougier et al. | |
| 2021/0126106 | A1 | 4/2021 | Wang et al. | |
| 2021/0175166 | A1 | 6/2021 | McGahay et al. | |
| 2021/0210489 | A1 | 7/2021 | Zhang et al. | |
| 2021/0233911 | A1 | 7/2021 | Feng et al. | |
| 2021/0358911 | A1 | 11/2021 | Zhang et al. | |
| 2022/0328642 | A1 * | 10/2022 | Jin | H10D 84/0188 |
| 2022/0392999 | A1 | 12/2022 | Iwahori | |
| 2023/0163168 | A1 * | 5/2023 | Agrawal | H10D 84/038 |
| | | | | 257/401 |

FOREIGN PATENT DOCUMENTS

| | | |
|---|---|---|
| WO | WO2021171969 A1 | 9/2021 |
| WO | 2023099115 A1 | 6/2023 |

OTHER PUBLICATIONS

P. Weckx et al., "Novel forksheet device architecture as ultimate logic scaling device towards 2nm," 2019 IEEE International Electron Devices Meeting (IEDM) (Dec. 2019) (4 pages).

Kow-Ming Chang et al., "A Novel Technology to Form Air Gap for ULSI Application," IEEE Electron Device Letters, vol. 20, No. 4, pp. 185-187 (Apr. 1999).

P. Weckx et al., "Stacked nanosheet fork architecture for SRAM design and device co-optimization toward 3nm," 2017 IEEE International Electron Devices Meeting (IEDM) (Dec. 2017) (4 pages).

* cited by examiner

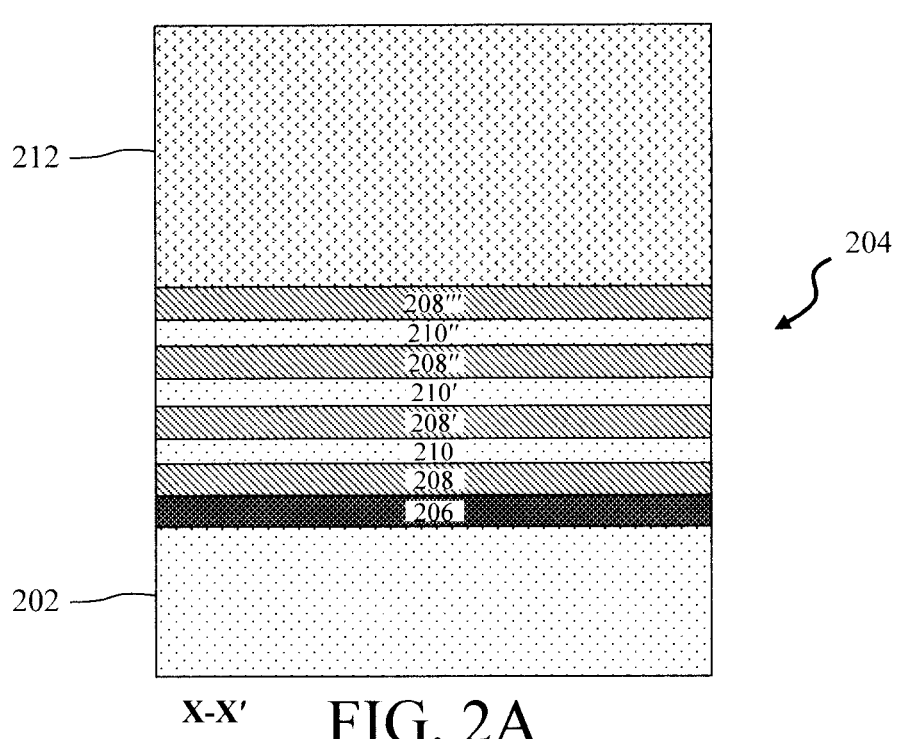
X-X′    FIG. 2A
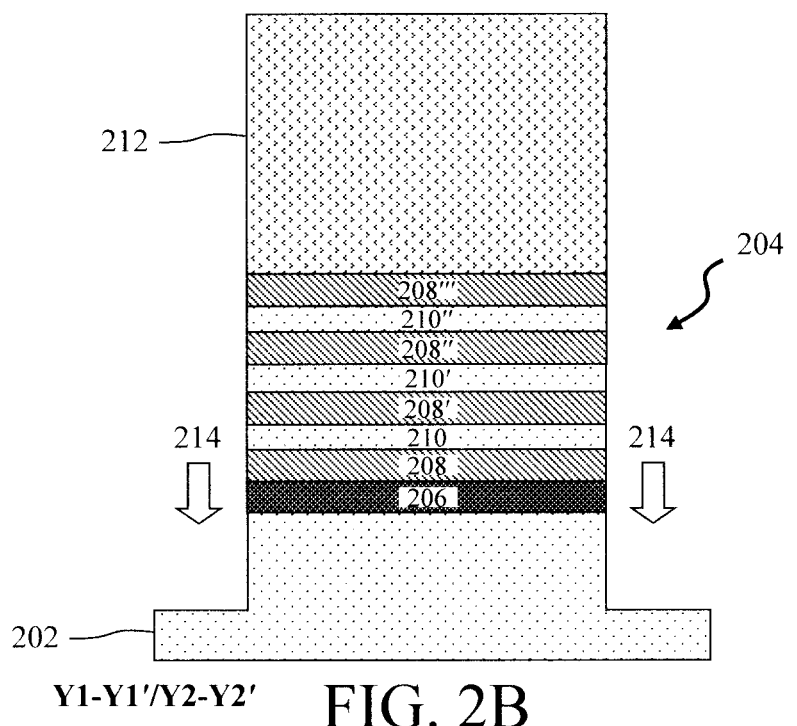
Y1-Y1′/Y2-Y2′    FIG. 2B

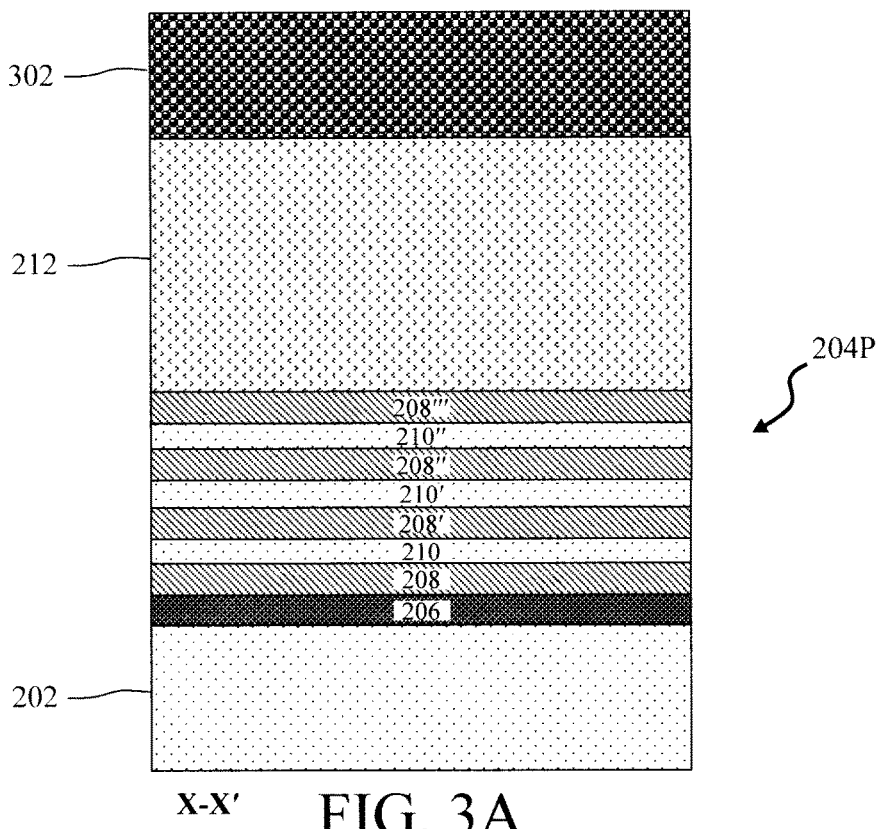
302
212
204P
208''''
210''
208''
210'
208'
210
208
206
202
X-X'     FIG. 3A
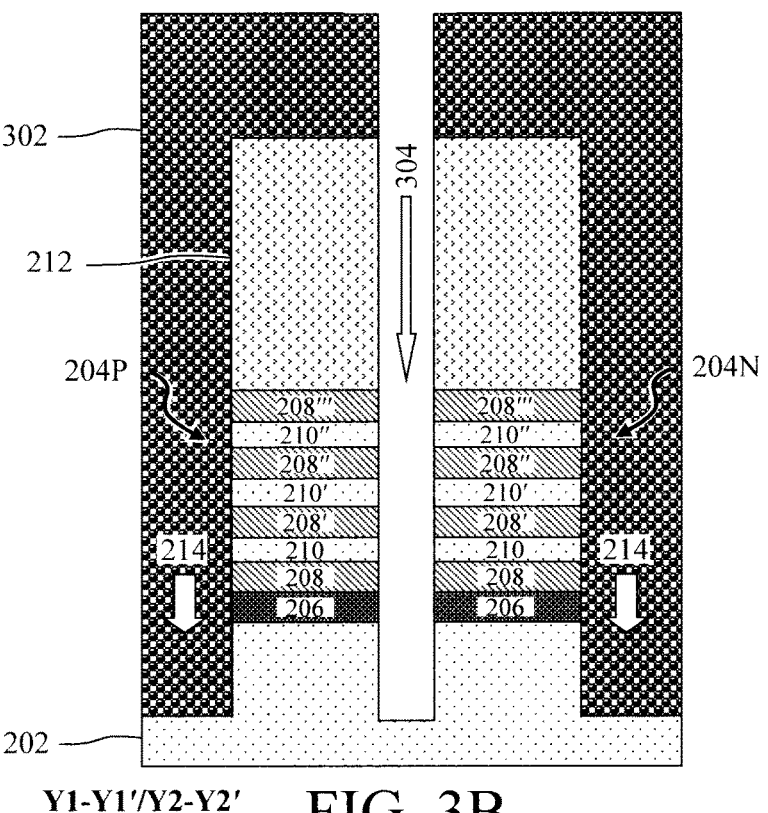
302
212
204P                                                    204N
208''''        208''''
210''          210''
208''          208''
210'           210'
208'           208'
214    210     210    214
208    208
206    206
202
Y1-Y1'/Y2-Y2'     FIG. 3B

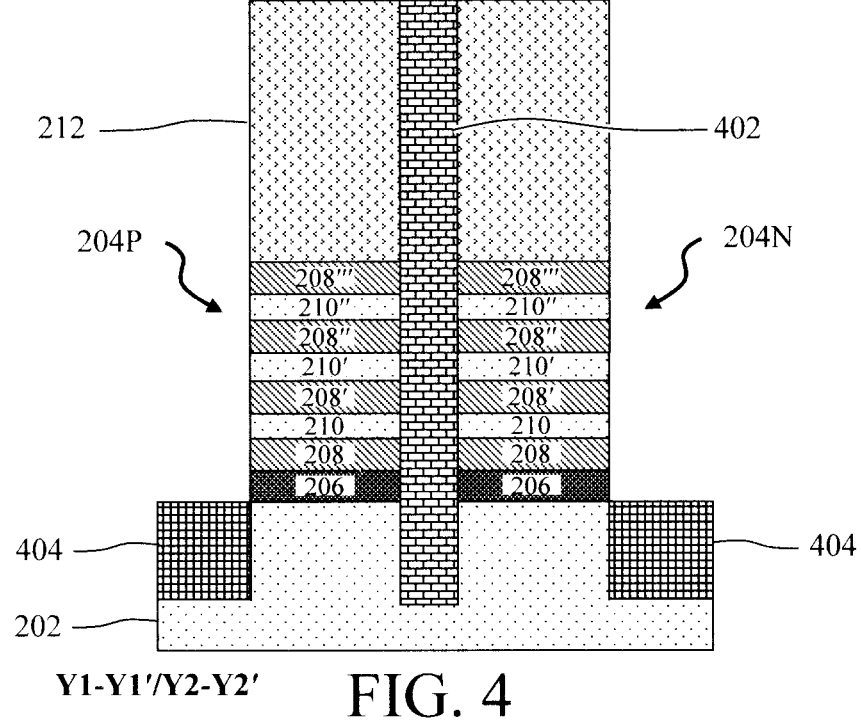
212
402
204P
204N
208'''
210''
208''
210'
208'
210
208
206
404
404
202
Y1-Y1'/Y2-Y2'          FIG. 4

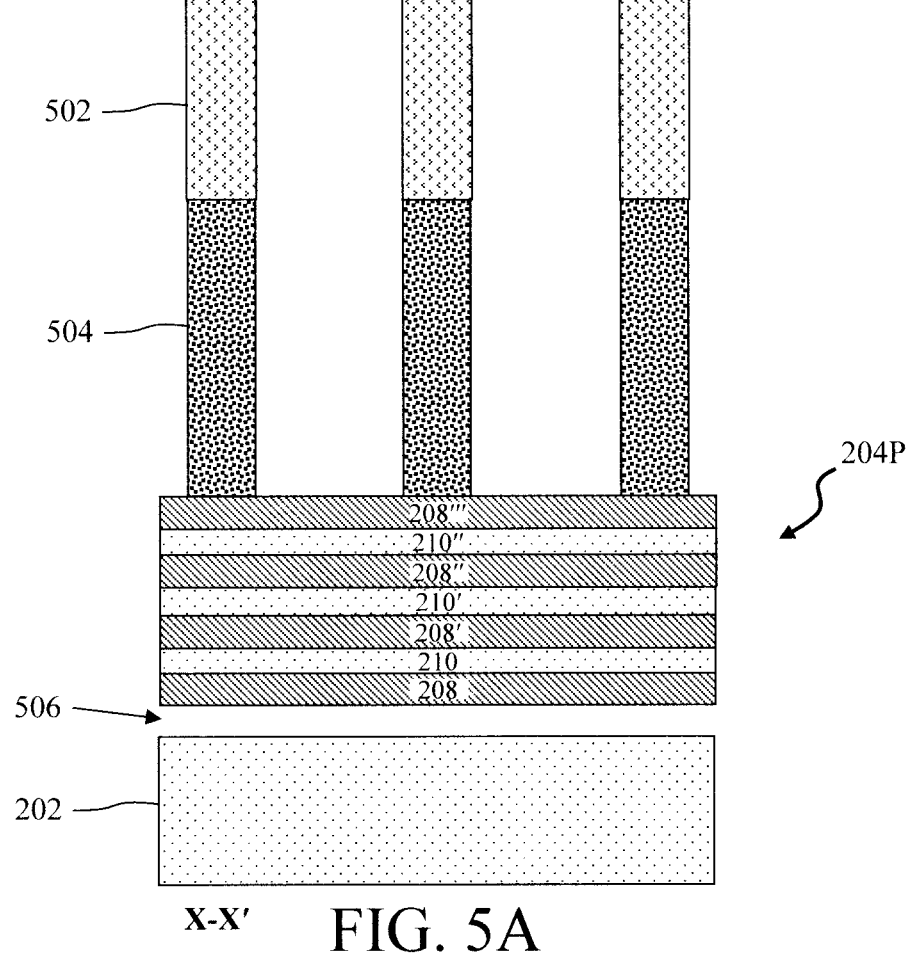
502
504
204P
208''''
210''
208''
210'
208'
210
208
506
202
X-X'     FIG. 5A

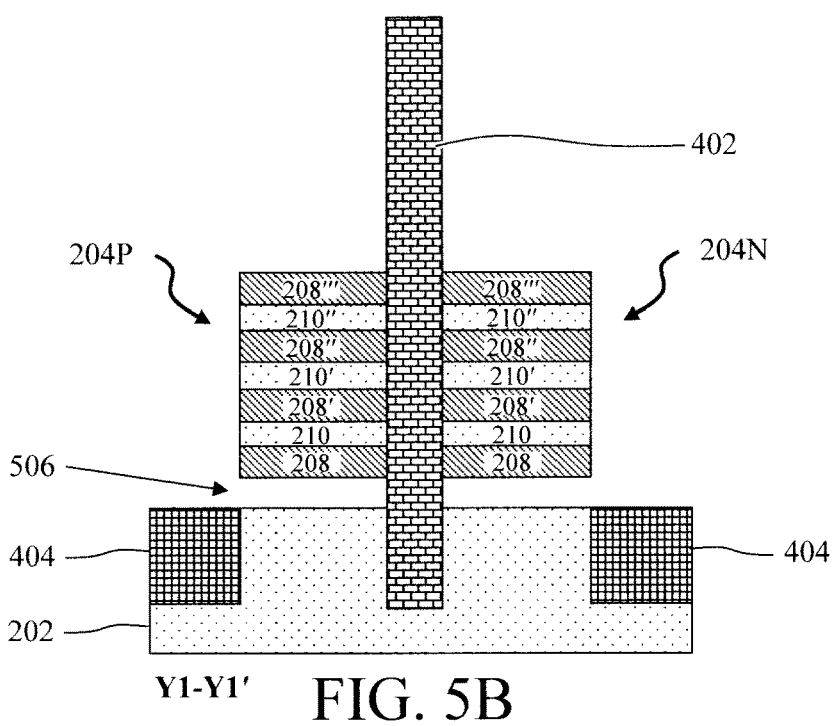
204P                204N
208'''        208'''
210''         210''
208''         208''
210'          210'
208'          208'
210           210
208           208
506
404                    404
202
Y1-Y1'        FIG. 5B
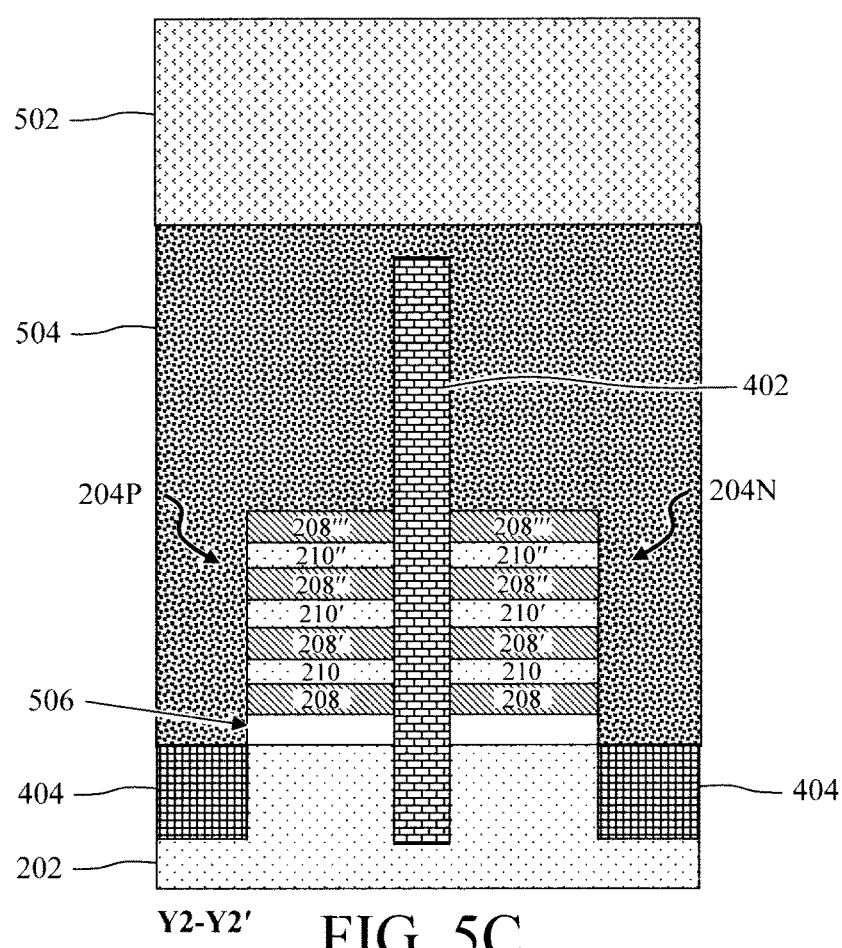
502
504
402
204P                204N
208'''        208'''
210''         210''
208''         208''
210'          210'
208'          208'
210           210
208           208
506
404                    404
202
Y2-Y2'        FIG. 5C

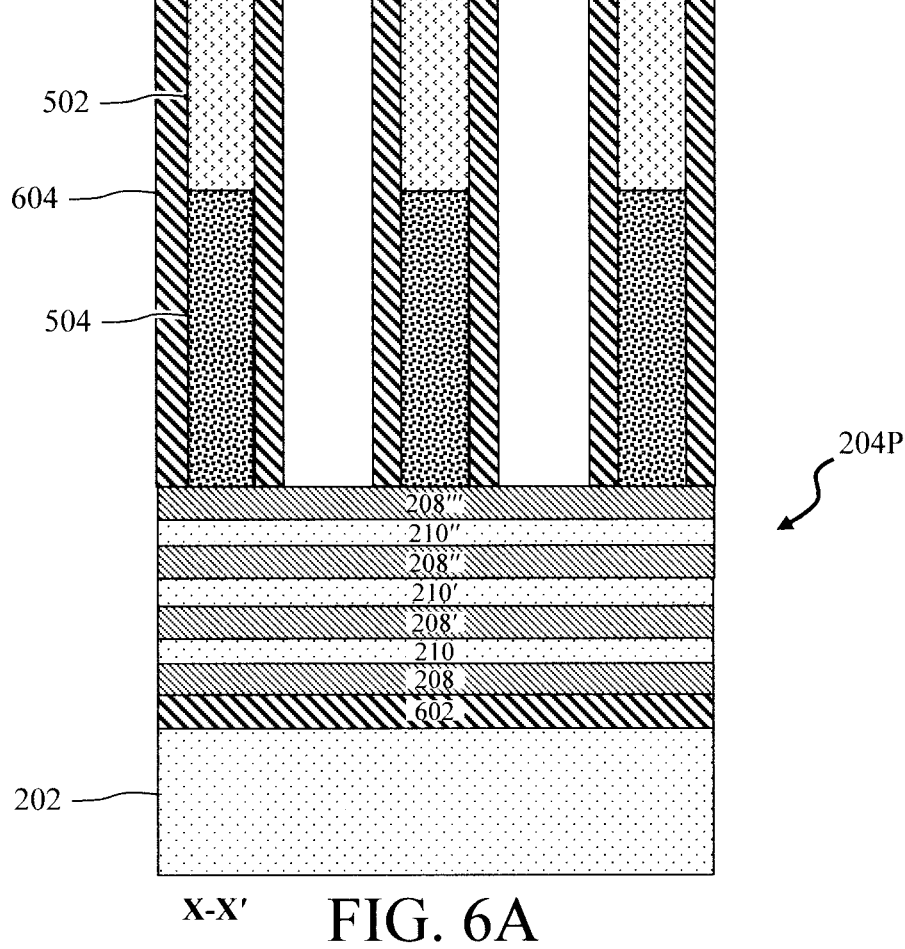
X-X'    FIG. 6A

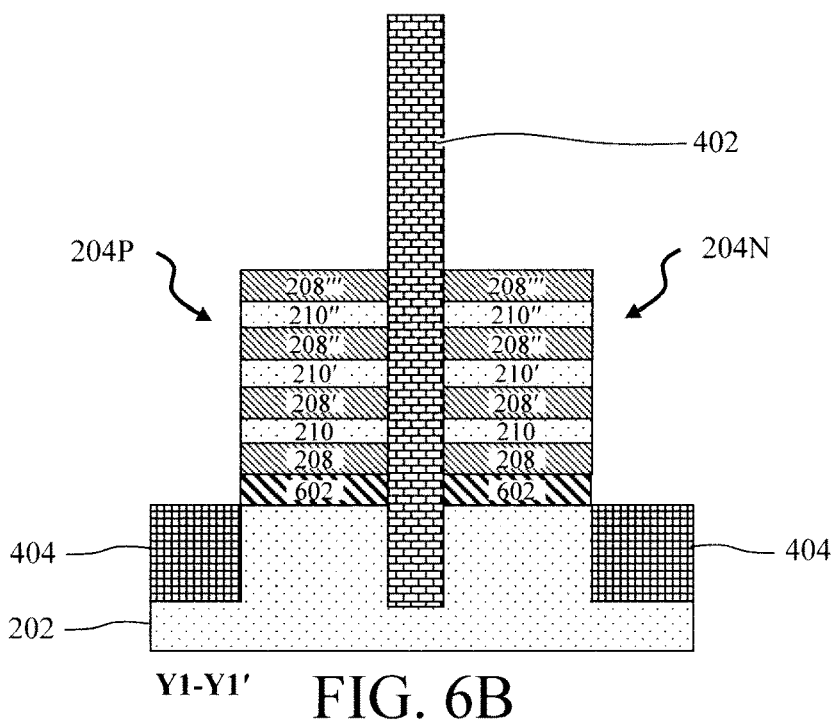
Y1-Y1'  FIG. 6B
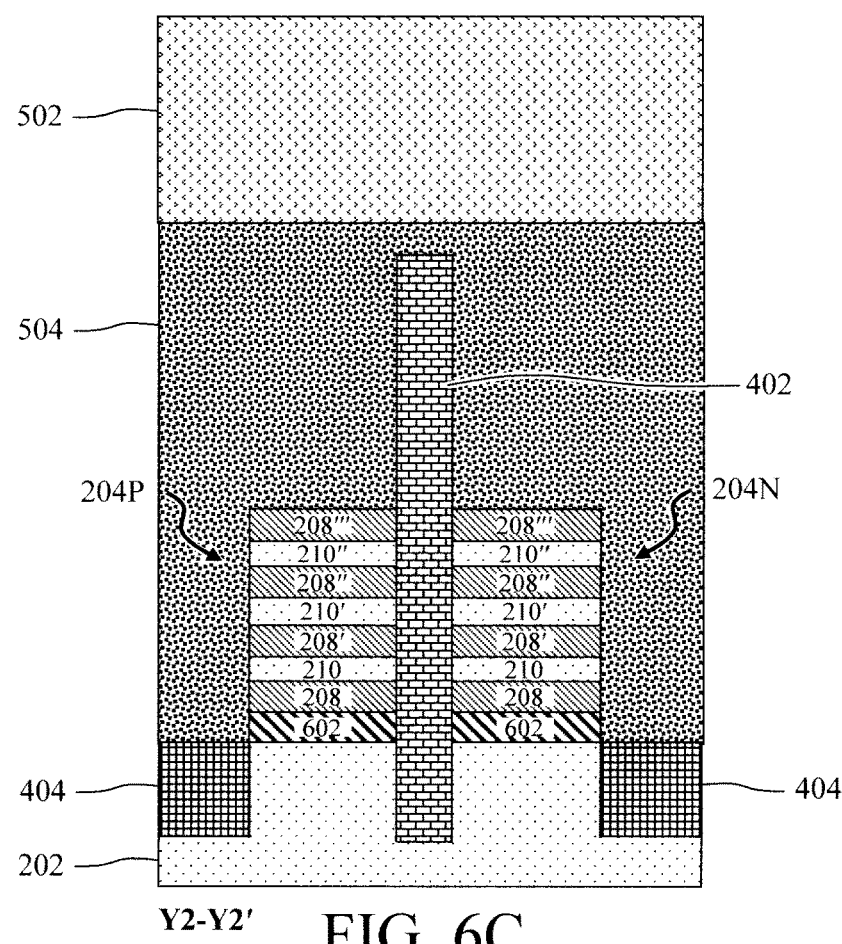
Y2-Y2'  FIG. 6C

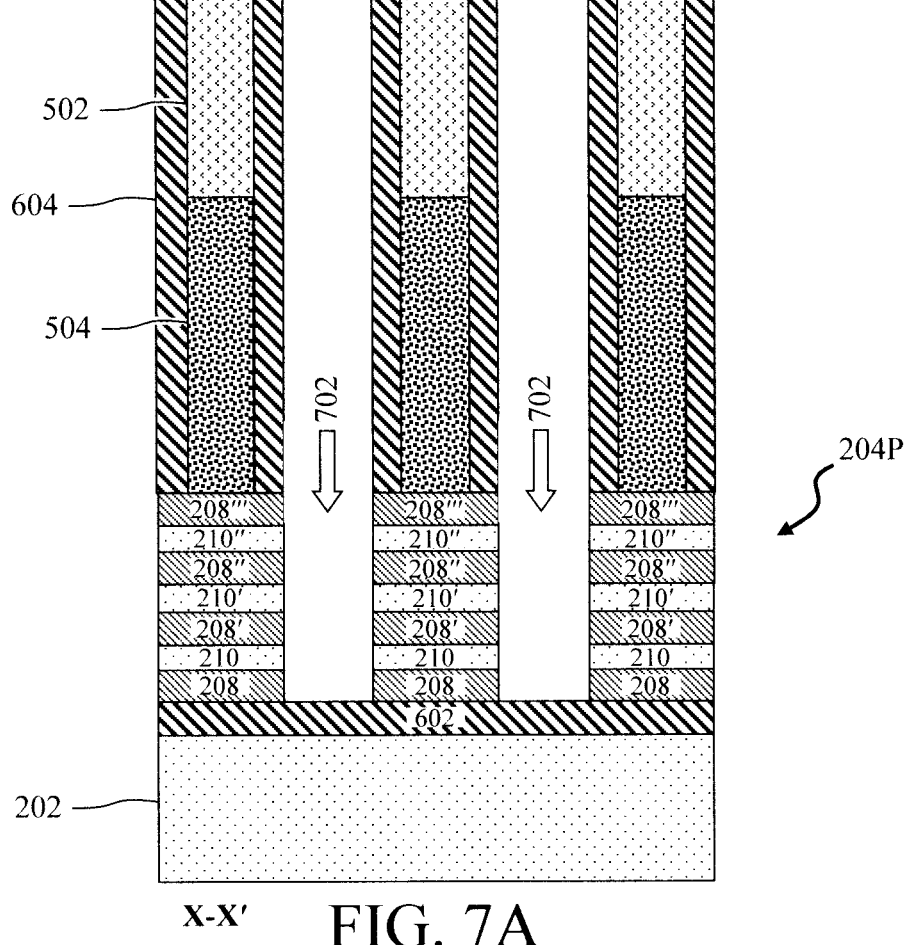
X-X′     FIG. 7A

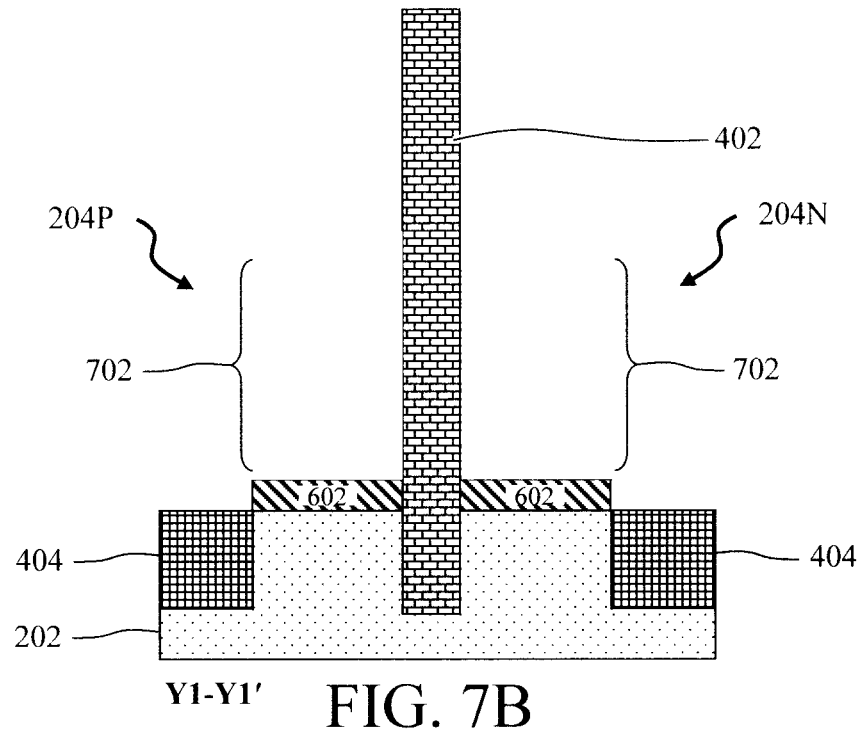
Y1-Y1'          FIG. 7B

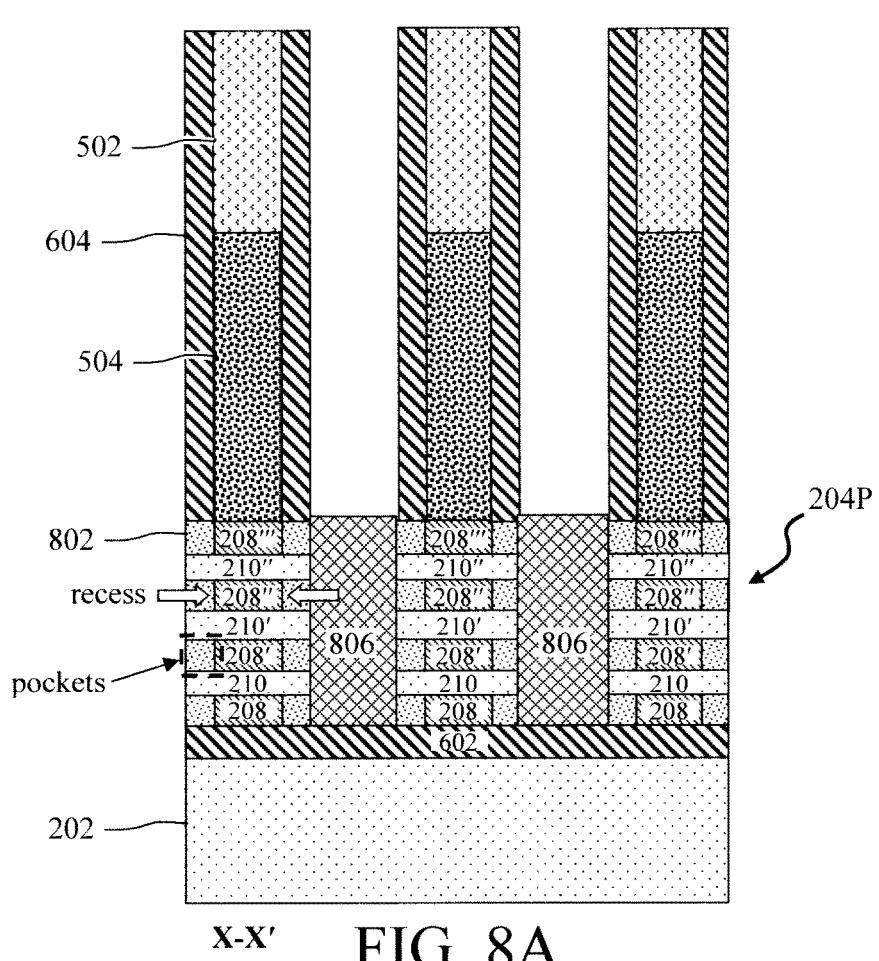
X-X'    FIG. 8A
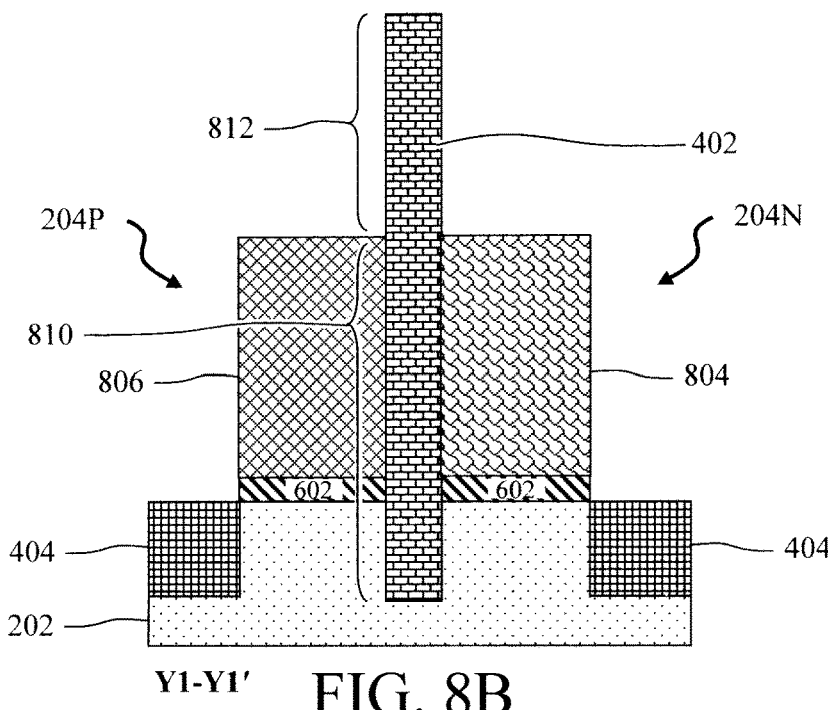
Y1-Y1'    FIG. 8B

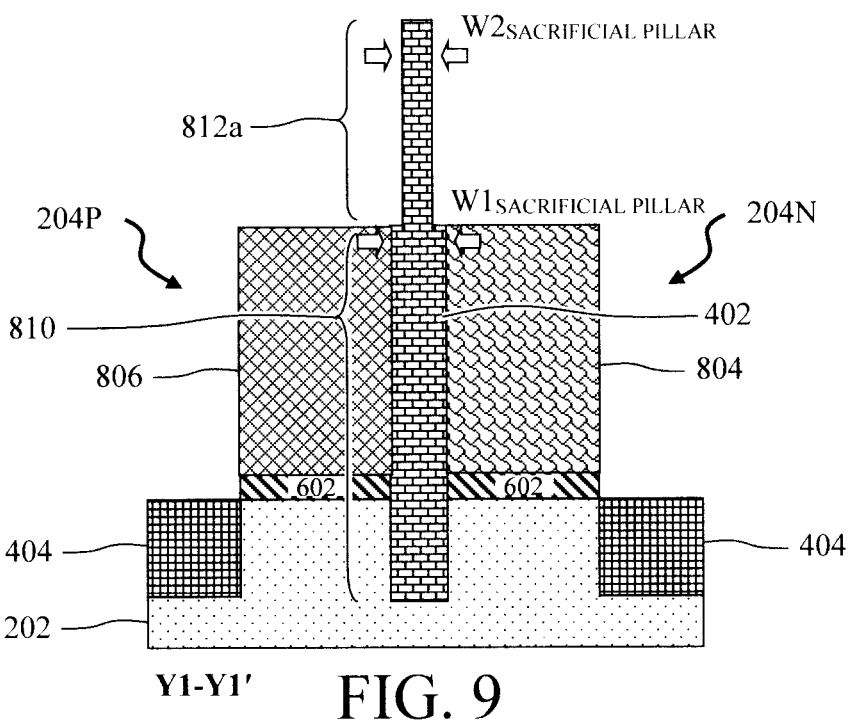
Y1-Y1′    FIG. 9
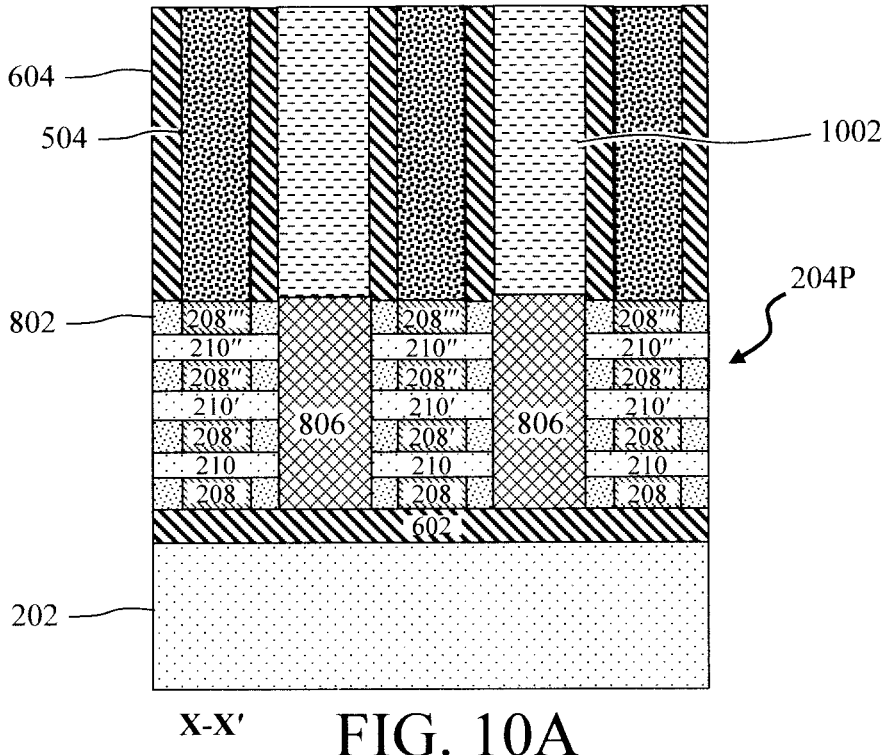
X-X′    FIG. 10A

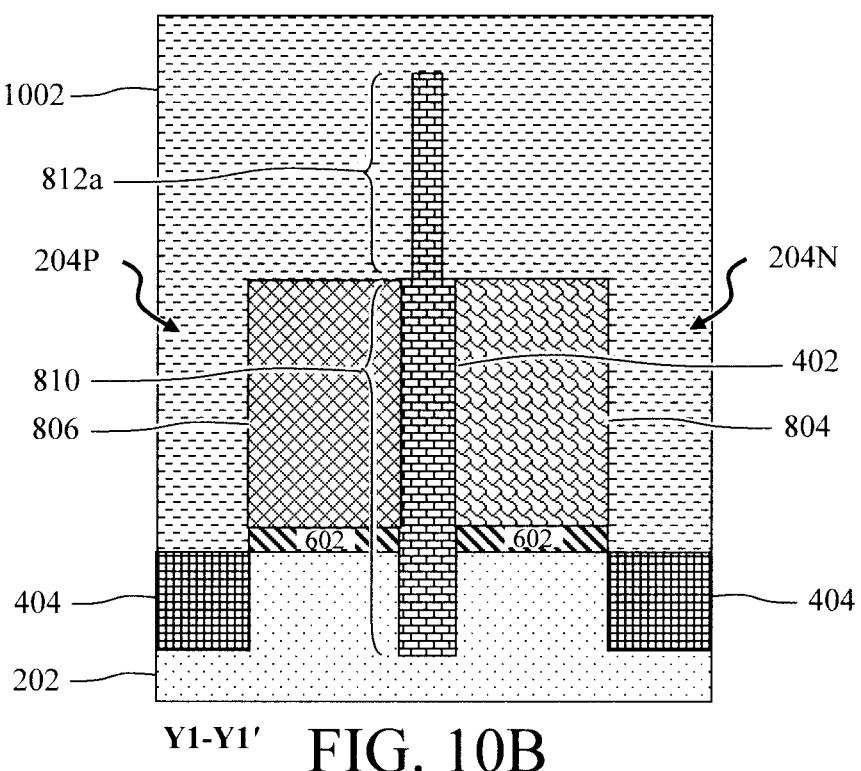
Y1-Y1′     FIG. 10B
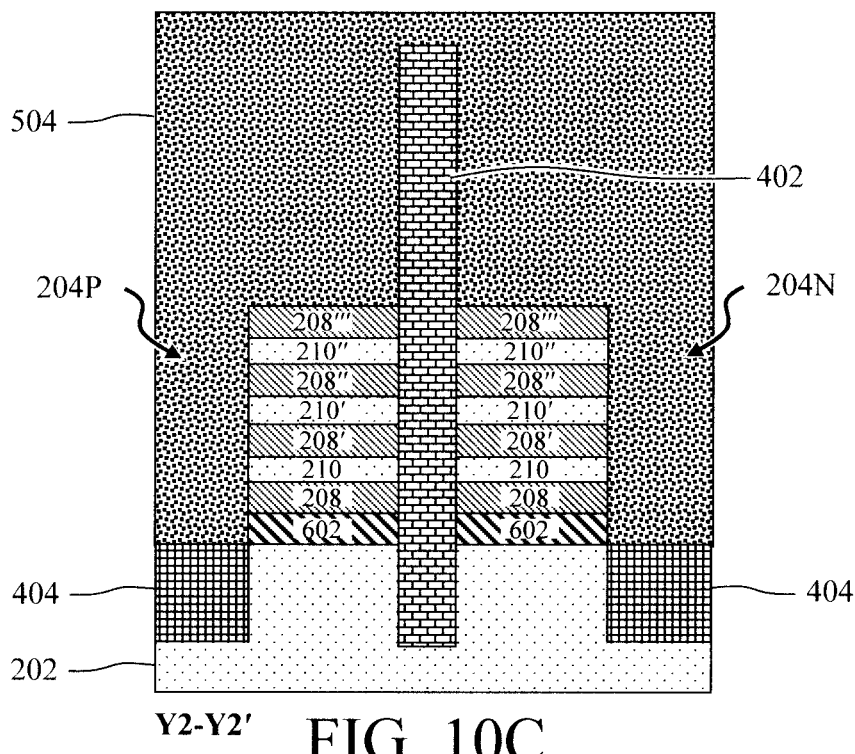
Y2-Y2′     FIG. 10C

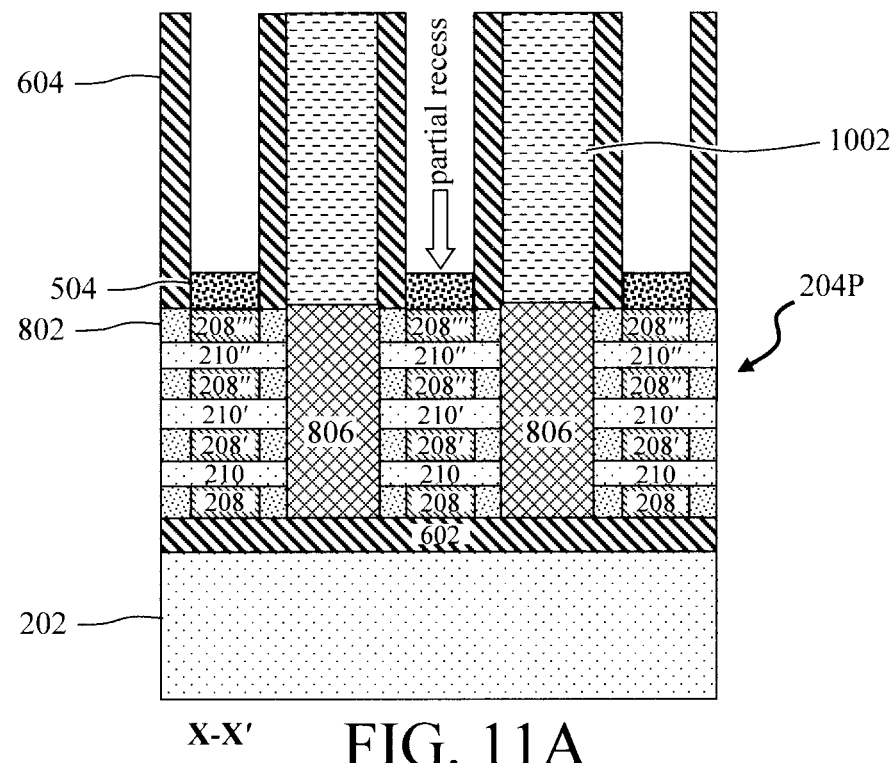
X-X′    FIG. 11A
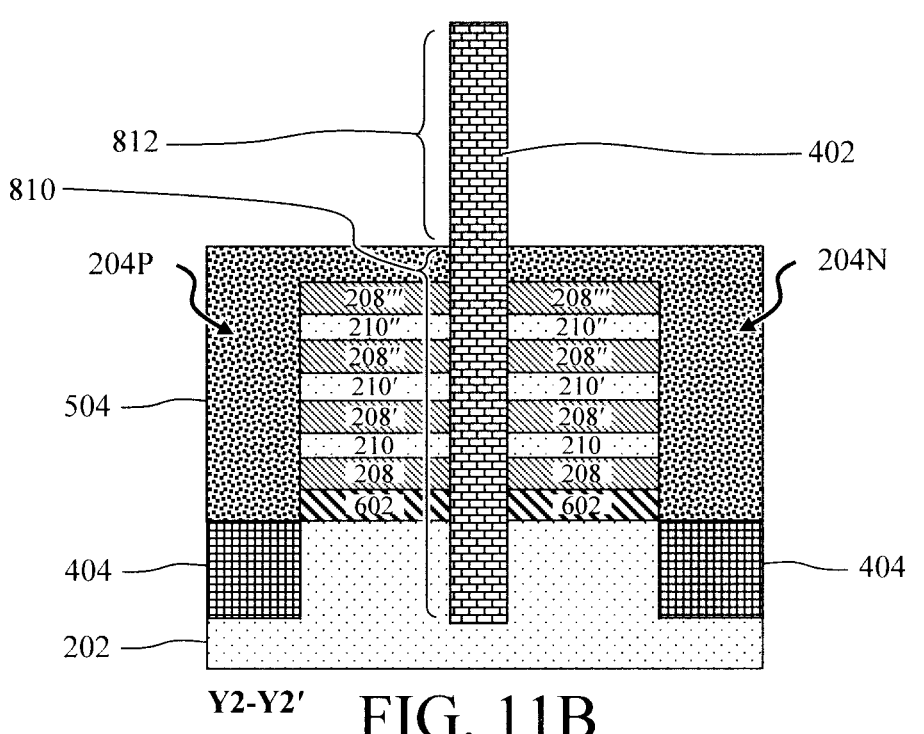
Y2-Y2′    FIG. 11B

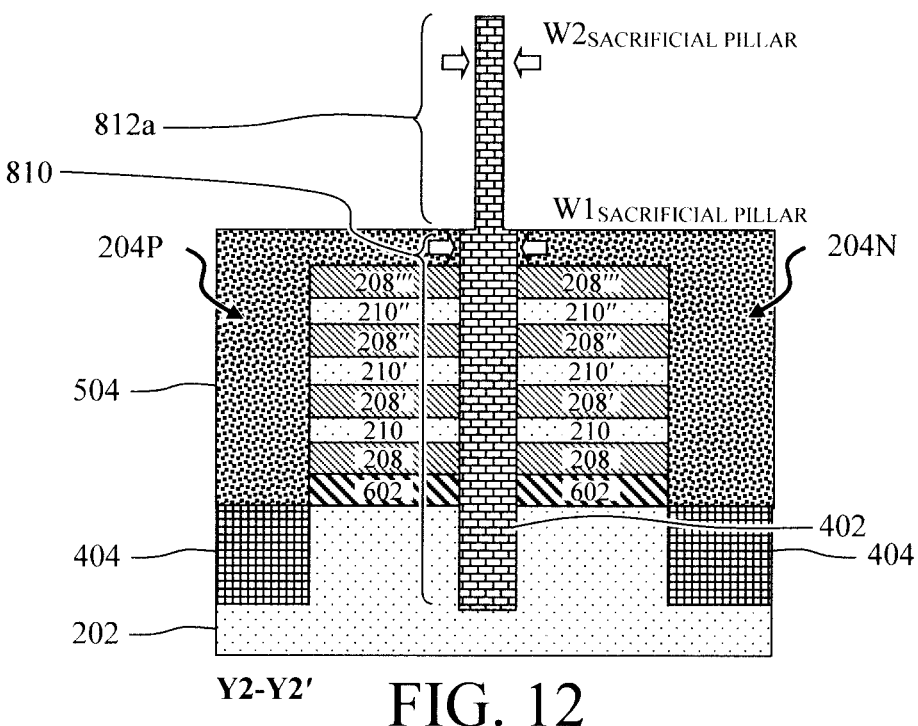
Y2-Y2'    FIG. 12
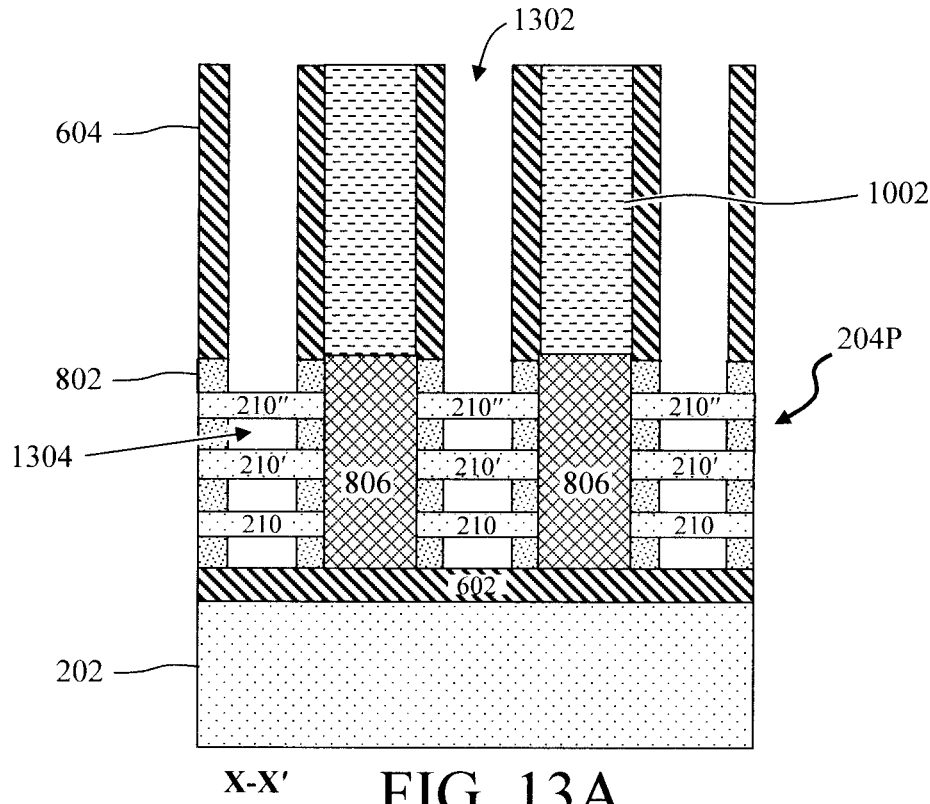
X-X'    FIG. 13A

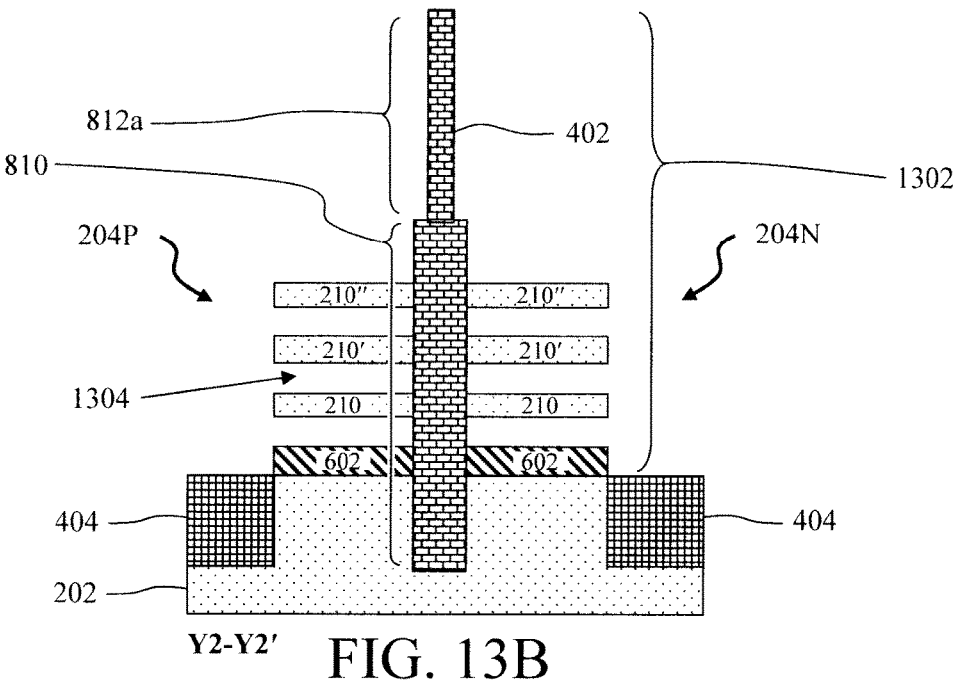
Y2-Y2′  FIG. 13B
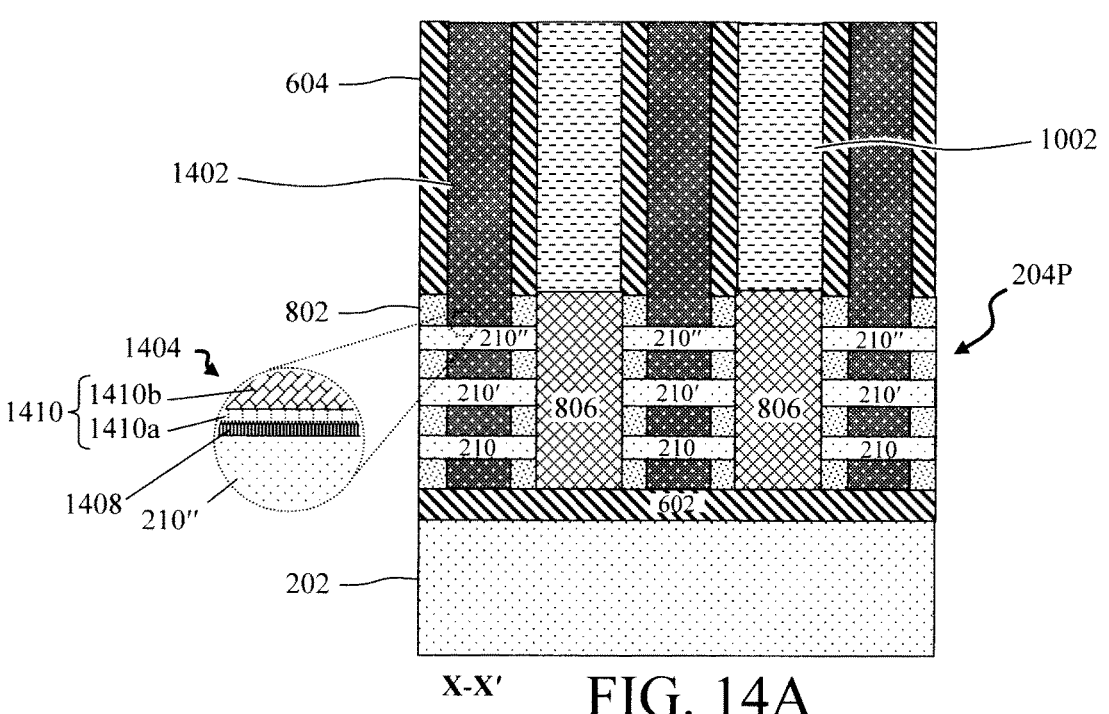
X-X′  FIG. 14A

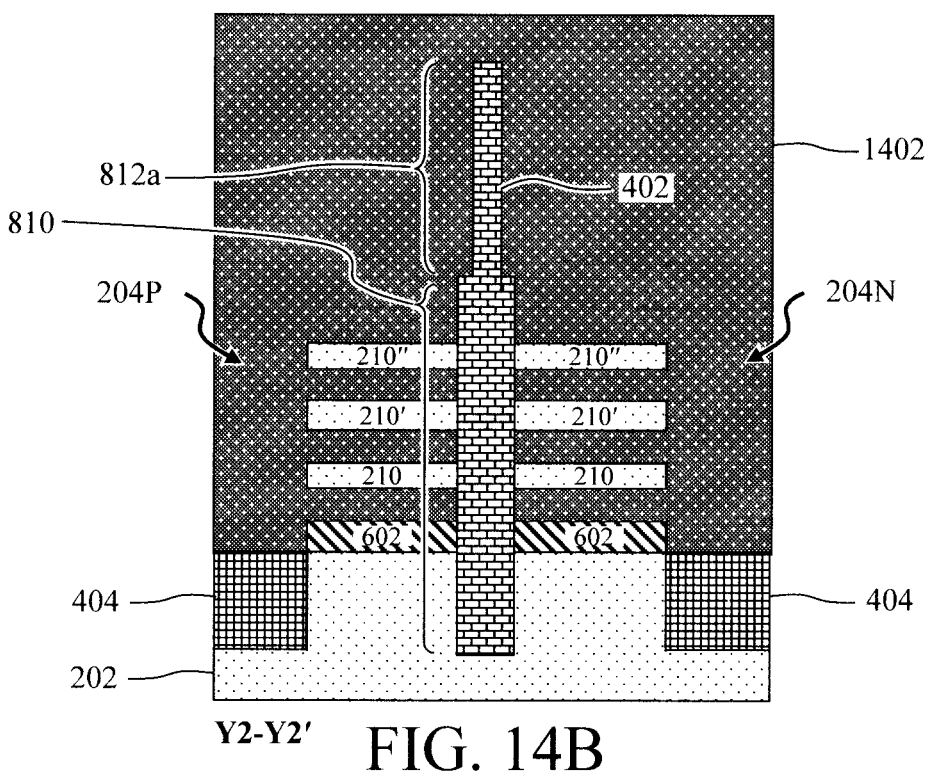
Y2-Y2'    FIG. 14B
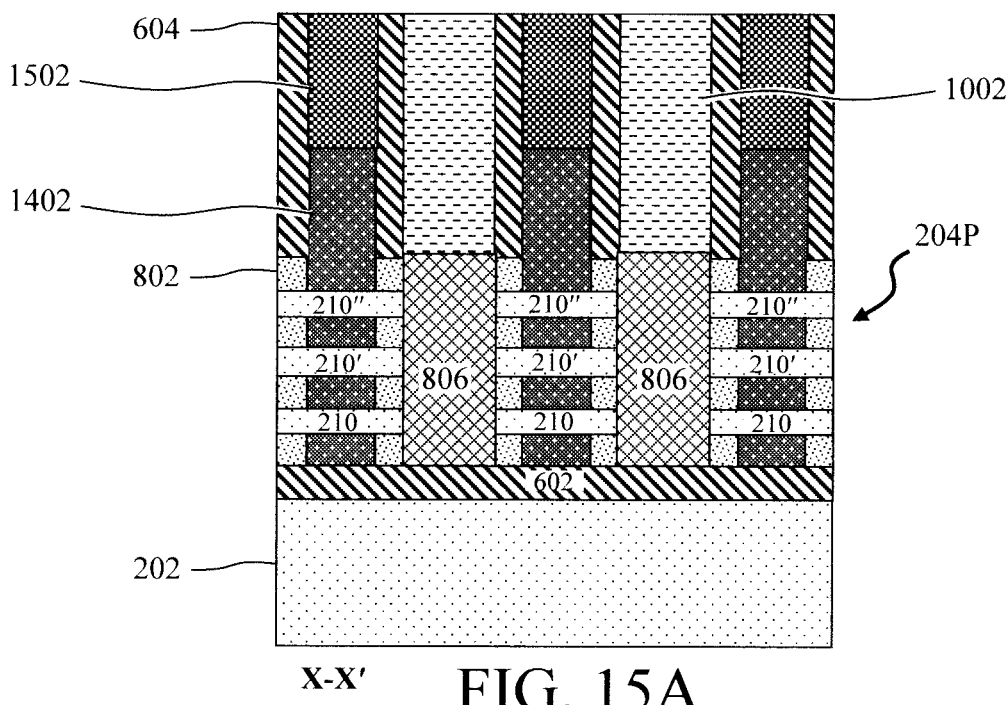
X-X'    FIG. 15A

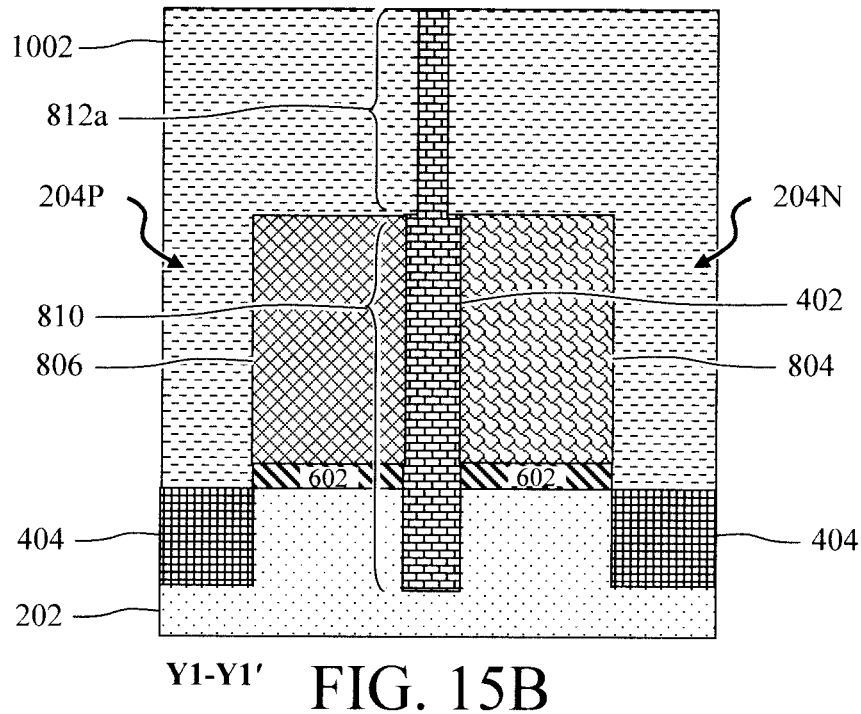
1002
812a
204P
810
806
204N
402
804
404
404
202
Y1-Y1'    FIG. 15B
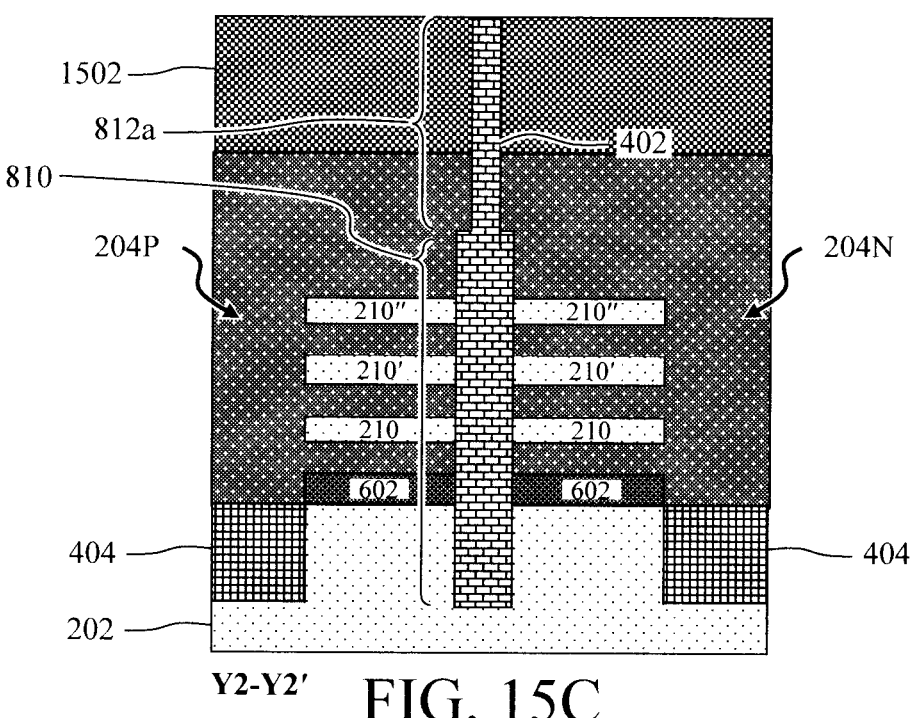
1502
812a
810
204P
204N
402
210″    210″
210′    210′
210    210
602    602
404    404
202
Y2-Y2'    FIG. 15C

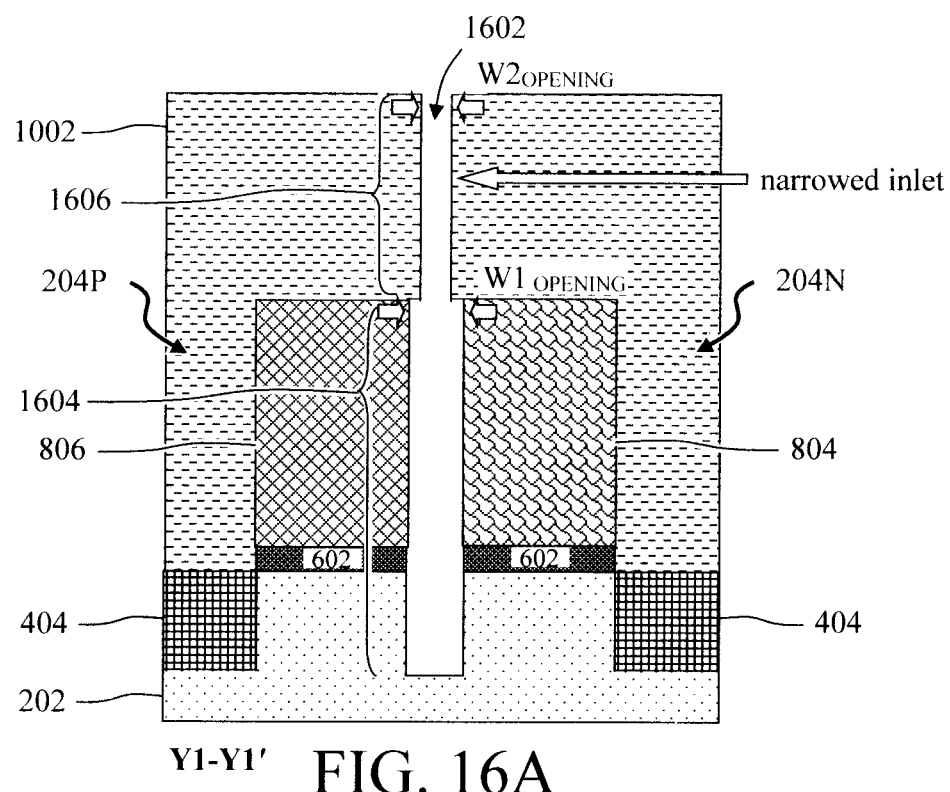
Y1-Y1′   FIG. 16A
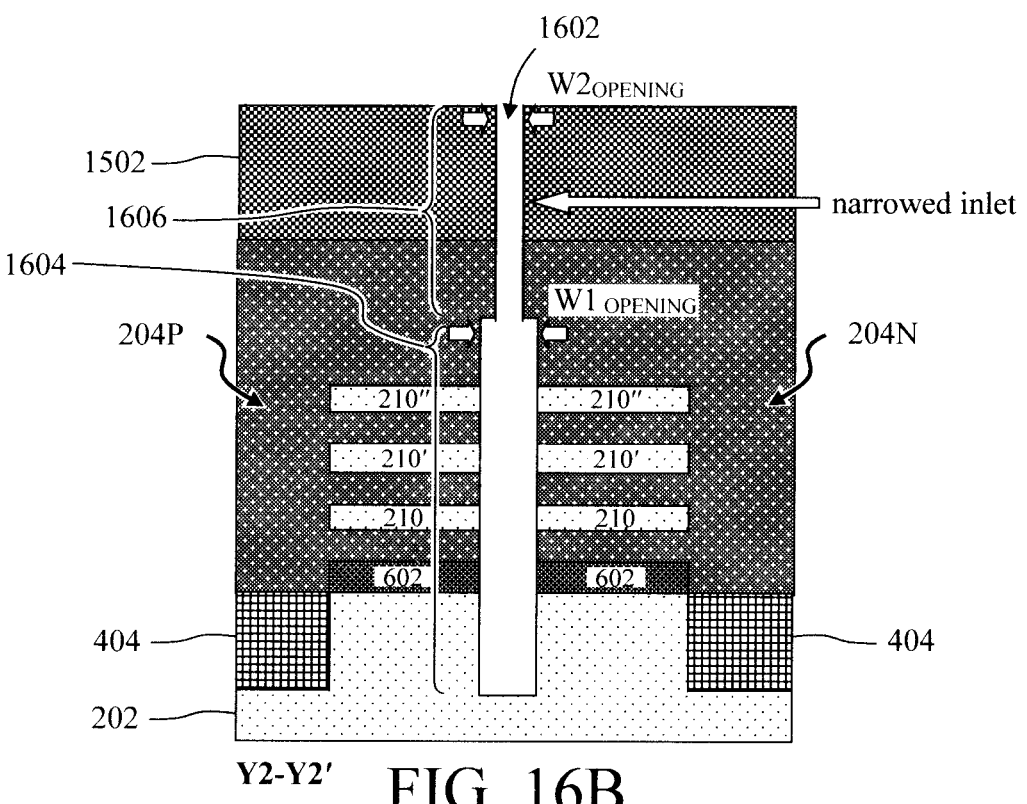
Y2-Y2′   FIG. 16B

FORK SHEET WITH REDUCED COUPLING EFFECT

FIELD OF THE INVENTION

The present invention relates to fork sheet field-effect transistor (FET) devices, and more particularly, to fork sheet FET devices with airgap isolation for reduced capacitance coupling.

BACKGROUND OF THE INVENTION

Fork sheet field-effect transistor (FET) devices offer further scaling opportunities over traditional finFET and nanosheet architectures. With a fork sheet device, the spacing between the n-channel FET (NFET) and p-channel FET (PFET) devices is reduced to permit further area scaling.

The implementation of a fork sheet FET design, however, can present some notable challenges. For instance, with a fork sheet FET design the NFET source/drain region can be in very close proximity to the PFET source/drain region, and the NFET gate can be in very close proximity to the PFET gate.

With conventional approaches, a minimal insulator is employed between the NFET and PFET source/drain regions and gates. As a result, capacitance coupling between the NFET and PFET source/drain regions and/or between the NFET and PFET gates can lead to false turn-on of the transistors and/or affect read/write stability.

Therefore, improved fork sheet FET device designs with reduced capacitance coupling would be desirable.

SUMMARY OF THE INVENTION

The present invention provides fork sheet field-effect transistor (FET) devices with airgap isolation for reduced capacitance coupling. In one aspect of the invention, a fork sheet FET device is provided. The fork sheet FET device includes: at least a first nanosheet FET (e.g., an n-channel FET (NFET)) and a second nanosheet FET (e.g., a p-channel FET (PFET)); and a dielectric pillar disposed directly between the first nanosheet FET and the second nanosheet FET, wherein the dielectric pillar includes an airgap. For example, the first nanosheet FET and the second nanosheet FET contact opposite sides of the dielectric pillar.

In another aspect of the invention, another fork sheet FET device is provided. The fork sheet FET device includes: at least a first nanosheet FET and a second nanosheet FET; and a dielectric pillar disposed directly between the first nanosheet FET and the second nanosheet FET, wherein the dielectric pillar includes an airgap, and wherein the first nanosheet FET and the second nanosheet FET have nanosheets that extend horizontally on opposite sides of the dielectric pillar.

In yet another aspect of the invention, a method of forming a fork sheet FET device is provided. The method includes: forming at least a first nanosheet FET and a second nanosheet FET having a sacrificial pillar disposed directly therebetween; removing the sacrificial pillar to form an opening in between the first nanosheet FET and the second nanosheet FET, wherein a bottom portion of the opening has a width $W1_{OPENING}$ and a top portion of the opening has a width $W2_{OPENING}$, and wherein $W2_{OPENING} < W1_{OPENING}$; and depositing a dielectric liner into and lining the opening wherein, during the depositing, the dielectric liner pinches off the top portion of the opening before fully filling the bottom portion of the opening based on $W2_{OPENING} < W1_{OPENING}$ thereby creating a dielectric pillar having an airgap between the first nanosheet FET and the second nanosheet FET.

A more complete understanding of the present invention, as well as further features and advantages of the present invention, will be obtained by reference to the following detailed description and drawings.

BRIEF DESCRIPTION OF THE DRAWINGS

FIG. 2A is an X-X' cross-sectional view illustrating a stack of alternating sacrificial and active layers having been formed on a substrate, and the stack having been patterned, and FIG. 2B is a Y1-Y1' and Y2-Y2' cross-sectional view illustrating the stack of alternating sacrificial and active layers having been formed on the substrate, and the stack having been patterned according to an embodiment of the present invention;

FIG. 3A is an X-X' cross-sectional view illustrating an n-channel FET (NFET)-to-p-channel FET (PFET) space having been opened in the stack which divides the stack into at least one NFET device stack 204N and at least one PFET device stack, and FIG. 3B is a Y1-Y1' and Y2-Y2' cross-sectional view illustrating the NFET-to-PFET space having been opened in the stack which divides the stack into the at least one NFET device stack and the at least one PFET device stack according to an embodiment of the present invention;

FIG. 4 is a Y1-Y1' and Y2-Y2' cross-sectional view illustrating a sacrificial material having been deposited into, and filling the NFET-to-PFET space forming a sacrificial pillar separating the NFET device stack and the PFET device stack, and shallow trench isolation (STI) regions having been formed at the base of the NFET/PFET device stacks according to an embodiment of the present invention;

FIG. 5A is an X-X' cross-sectional view illustrating sacrificial gates having been formed over the NFET and PFET device stacks, and a first sacrificial layer having been removed forming a cavity below the NFET and PFET device stacks, FIG. 5B is a Y1-Y1' cross-sectional view illustrating the sacrificial gates having been formed over the NFET and PFET device stacks, and the first sacrificial layer having been removed forming the cavity below the NFET and PFET device stacks, and FIG. 5C is a Y2-Y2' cross-sectional view illustrating the sacrificial gates having been formed over the NFET and PFET device stacks, and the first sacrificial layer having been removed forming the cavity below the NFET and PFET device stacks according to an embodiment of the present invention;

FIG. 6A is an X-X' cross-sectional view illustrating a dielectric spacer material having been deposited over the sacrificial gates and into/filling the cavity, and the dielectric spacer material having been patterned into a bottom dielectric isolation layer in the cavity and gate spacers alongside the sacrificial gates, FIG. 6B is a Y1-Y1' cross-sectional view illustrating the dielectric spacer material having been deposited over the sacrificial gates and into/filling the cavity, and the dielectric spacer material having been patterned into the bottom dielectric isolation layer in the cavity and the gate spacers alongside the sacrificial gates, and FIG. 6C is a Y2-Y2' cross-sectional view illustrating the dielectric spacer material having been deposited over the sacrificial gates and into/filling the cavity, and the dielectric spacer material having been patterned into the bottom dielectric isolation layer in the cavity and the gate spacers alongside the sacrificial gates according to an embodiment of the present invention;

FIG. 7A is an X-X' cross-sectional view illustrating the sacrificial gates and gate spacers having been used as a mask to pattern trenches in the NFET and PFET device stacks in between the sacrificial gates, and FIG. 7B is a Y1-Y1' cross-sectional view illustrating the sacrificial gates and gate spacers having been used as a mask to pattern trenches in the NFET and PFET device stacks in between the sacrificial gates according to an embodiment of the present invention;

FIG. 8A is an X-X' cross-sectional view illustrating inner spacers having been formed alongside second sacrificial layers in the NFET and PFET device stacks, and NFET and PFET source/drain regions having been formed in the trenches on opposite sides of the sacrificial gates alongside the second sacrificial layers and active layers in the NFET and PFET device stacks, and FIG. 8B is a Y1-Y1' cross-sectional view illustrating the inner spacers having been formed alongside the second sacrificial layers in the NFET and PFET device stacks, and the NFET and PFET source/drain regions having been formed in the trenches on opposite sides of the sacrificial gates alongside the second sacrificial layers and the active layers in the NFET and PFET device stacks according to an embodiment of the present invention;

FIG. 9 is a Y1-Y1' cross-sectional view illustrating a top portion of the sacrificial pillar that is exposed above the NFET/PFET source/drain regions having been trimmed according to an embodiment of the present invention;

FIG. 10A is an X-X' cross-sectional view illustrating an interlayer dielectric (ILD) having been deposited over, and burying, the NFET/PFET device stacks (and sacrificial pillar therebetween), sacrificial gates and gate spacers, and the NFET/PFET source/drain regions, FIG. 10B is a Y1-Y1' cross-sectional view illustrating the ILD having been deposited over, and burying, the NFET/PFET device stacks (and sacrificial pillar therebetween), sacrificial gates and gate spacers, and the NFET/PFET source/drain regions, and FIG. 10C is a Y2-Y2' cross-sectional view illustrating the ILD having been deposited over, and burying, the NFET/PFET device stacks (and sacrificial pillar therebetween), sacrificial gates and gate spacers, and the NFET/PFET source/drain regions according to an embodiment of the present invention;

FIG. 11A is an X-X' cross-sectional view illustrating a partial recess of the sacrificial gates having been performed to expose the top portion of the sacrificial pillar in a gate region of the device, and FIG. 11B is a Y2-Y2' cross-sectional view illustrating the partial recess of the sacrificial gates having been performed to expose the top portion of the sacrificial pillar in the gate region of the device according to an embodiment of the present invention;

FIG. 12 is a Y2-Y2' cross-sectional view illustrating the top portion of the sacrificial pillar that is exposed above the NFET and PFET device stacks having been trimmed. according to an embodiment of the present invention;

FIG. 13A is an X-X' cross-sectional view illustrating the remainder of the sacrificial gates having been selectively removed forming gate trenches in the ILD over the NFET and PFET device stacks in between the NFET/PFET source/drain regions, and the second sacrificial layers having been removed from the NFET and PFET device stacks forming gaps between the active layers, and FIG. 13B is a Y2-Y2' cross-sectional view illustrating the remainder of the sacrificial gates having been selectively removed forming the gate trenches in the ILD over the NFET and PFET device stacks in between the NFET/PFET source/drain regions, and the second sacrificial layers having been removed from the NFET and PFET device stacks forming the gaps between the active layers according to an embodiment of the present invention;

FIG. 14A is an X-X' cross-sectional view illustrating replacement gates having been formed in the gate trenches and gaps, and FIG. 14B is a Y2-Y2' cross-sectional view illustrating the replacement gates having been formed in the gate trenches and gaps according to an embodiment of the present invention;

FIG. 15A is an X-X' cross-sectional view illustrating the replacement gates having been recessed and dielectric caps having been formed over the (recessed) replacement gates, FIG. 15B is a Y1-Y1' cross-sectional view illustrating the replacement gates having been recessed and dielectric caps having been formed over the (recessed) replacement gates, and FIG. 15C is a Y2-Y2' cross-sectional view illustrating the replacement gates having been recessed and dielectric caps having been formed over the (recessed) replacement gates according to an embodiment of the present invention;

FIG. 16A is a Y1-Y1' cross-sectional view illustrating the sacrificial pillar having been removed, forming an opening in between the NFET and PFET source/drain regions in the source/drain region of the fork sheet FET device, and in between the replacement gates over the NFET and PFET device stacks in the gate region of the fork sheet FET device, and FIG. 16B is a Y2-Y2' cross-sectional view illustrating the sacrificial pillar having been removed, forming the opening in between the NFET and PFET source/drain regions in the source/drain region of the fork sheet FET device, and in between the replacement gates over the NFET and PFET device stacks in the gate region of the fork sheet FET device according to an embodiment of the present invention.

DETAILED DESCRIPTION OF PREFERRED EMBODIMENTS

As provided above, a fork sheet field-effect transistor (FET) design can present some notable challenges. Namely, placing the NFET source/drain region in very close proximity to the PFET source/drain region, and the NFET gate in very close proximity to the PFET gate increases the risk of capacitance coupling, which can lead to false turn-on of the transistors and/or affect read/write stability.

Advantageously, provided herein are fork sheet FET devices with airgap isolation which vastly reduces capacitance coupling as compared to conventional designs. Namely, with conventional designs, a dielectric material such as silicon oxide (SiOx) and/or silicon nitride (SiN) is used to separate the NFET and PFET devices in a fork sheet FET. Even so, the effect of capacitance coupling on the device performance remains significant. On the other hand, air has a significantly lower dielectric constant than these conventional oxide and nitride dielectric materials. For instance, by way of example only, at room temperature (i.e., 25 degrees Celsius (° C.)), air has a dielectric constant of 1.00059, whereas SiN has a dielectric constant of about 9.5.

Thus, implementing an airgap spacer in between the NFET and PFET devices in a fork sheet FET would greatly reduce the capacitance coupling.

Figure 1:
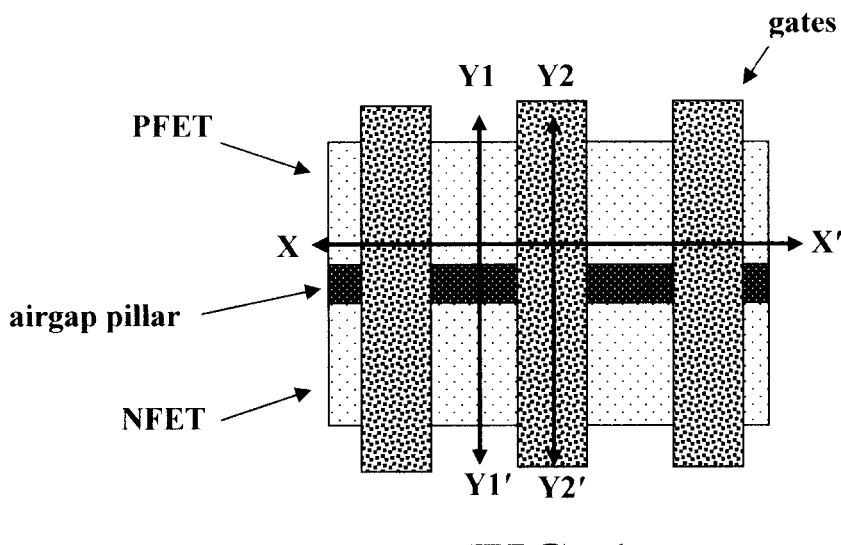
FIG. 1 is a top-down view of the general layout of the present fork sheet field-effect transistor (FET) device structure and the orientations of the various cuts depicted in the figures according to an embodiment of the present invention.

An exemplary methodology for fabricating a fork sheet FET device with airgap isolation in accordance with the present techniques is now described by way of reference to FIGS. 1-17. In each of the following figures, a cross-sectional view through a part of the fork sheet FET device structure will be provided. See, for example, FIG. 1 which shows a top-down view of the general layout of the present fork sheet FET device structure and the orientations of the various cuts that will be depicted in the figures. As shown in FIG. 1, according to an exemplary embodiment the present fork sheet FET device includes at least one n-channel FET (NFET) device (labeled 'NFET') and at least one p-channel (PFET) device (labeled 'PFET') separated by a pillar with airgap isolation (labeled 'airgap pillar). For clarity, the terms 'first' and 'second' may also be used herein when referring to the NFET and PFET devices, respectively. As will be described in detail below, each NFET/PFET device contains a stack of layers (e.g., nanosheets) which extend horizontally along a first direction (in this case an X-direction) on opposite sides of the airgap pillar. As will be described in detail below, the airgap pillar is a vertical structure that is disposed directly between the NFET and PFET stacks. Gates of the fork sheet FET device (labeled 'gates') are present over the NFET and PFET stacks. As shown in FIG. 1, the gates extend along a second direction (in this case a Y-direction) which is perpendicular to the first/X-direction.

The pattern used in FIG. 1 for the gates is representative of the sacrificial gates that will be placed over the NFET and PFET device stacks early on in the process. Namely, as will be described in detail below, a replacement gate process is employed in this example where these sacrificial gates serve as placeholders during source/drain region formation, and which are later replaced with the final gates of the fork sheet FET device (also referred to herein as 'replacement gates'). It is notable, however, that the orientation of the gates with respect to the NFET and PFET device stacks is the same for both the sacrificial and replacement gates.

As shown in FIG. 1, a cross-section X-X' will provide views of cuts through the PFET device stack perpendicular to the gates. It is notable that the processes that will be depicted by way of reference to the cross-sectional cuts X-X' through the PFET device stack are performed in exactly the same manner in the NFET device stack, and thus would appear the same. One cross-section Y1-Y1' will provide views of cuts through, and perpendicular to, the NFET and PFET device stacks in between two of the gates. Another cross-section Y2-Y2' will provide views of cuts through, and perpendicular to, the NFET and PFET device stacks through one of the gates.

The process begins with the formation of a stack 204 of alternating sacrificial and active layers on a substrate 202, followed by patterning of the stack 204. See FIG. 2A (an X-X' cross-sectional view) and FIG. 2B (a Y1-Y1' and Y2-Y2' cross-sectional view). Namely, at this stage in the process, the Y1-Y1' and Y2-Y2' cross-sectional views would appear the same, i.e., as that shown in FIG. 2B.

According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

The stack 204 is formed by depositing sacrificial and active layers, one on top of another, onto the substrate 202. According to an exemplary embodiment, the sacrificial and active layers in the stack 204 are nanosheets. The term 'nanosheet' as used herein generally refers to a sheet or a layer having nanoscale dimensions. Further, the term 'nanosheet' is meant to encompass other nanoscale structures such as nanowires. For instance, the term 'nanosheet' can refer to a nanowire with a larger width and/or the term 'nanowire' can refer to a nanosheet with a smaller width, and vice versa.

In the present example, the stack 204 includes a (first) sacrificial layer 206 deposited directly on the substrate 202, and alternating (second) sacrificial layers 208, 208', 208", 208''', etc. and active layers 210, 210', 210", etc. deposited on the first sacrificial layer 206. The term 'sacrificial' as used herein refers to a structure(s) (such as sacrificial layer 206/sacrificial layers 208, 208', 208", 208''', etc.) that is/are removed, in whole or in part, during fabrication of the fork sheet FET device. By contrast, as will be described in detail below, the active layers 210, 210', 210", etc. will remain in place and serve as channels of the fork sheet FET device. It is notable that the number of sacrificial layers 208, 208', 208", 208''', etc., and active layers 210, 210', 210", etc. shown in the figures is merely provided as an example meant to illustrate the present techniques, and embodiments are contemplated herein where more or fewer sacrificial layers 208, 208', 208", 208''', etc. and/or more or fewer active layers 210, 210', 210", etc. are present in the stack 204 than is shown.

By way of example only, the sacrificial layer 206 and each of the sacrificial layers 208, 208', 208", 208''', etc. and active layers 210, 210', 210", etc. can be deposited on the substrate 202 using an epitaxial growth process. According to an exemplary embodiment, the sacrificial layer 206 and each of the sacrificial layers 208, 208', 208", 208''', etc. and active layers 210, 210', 210", etc. has a thickness of from about 6 nanometers (nm) to about 25 nm and ranges therebetween.

The materials employed for the sacrificial and active layers are such that the sacrificial layers 208, 208', 208", 208''', etc. can be selectively removed relative to the active layers 210, 210', 210", etc. later on in the process. Further, the materials employed for the first and second sacrificial layers are such that the sacrificial layer 206 can be selectively removed relative to the sacrificial layers 208, 208', 208", 208''', etc. later on in the process. This will enable the formation of a bottom dielectric isolation layer. Advantageously, a bottom dielectric isolation layer prevents source/drain region leakage through the substrate 202.

For instance, according to an exemplary embodiment, the sacrificial layer 206 and each of the sacrificial layers 208, 208', 208", 208''', etc. is formed from SiGe, while each of the active layers 210, 210', 210", etc. is formed from Si. In that case, etchants such as wet hot SC1, vapor phase hydrogen chloride (HCl), vapor phase chlorine trifluoride ($ClF_3$) and other reactive clean processes (RCP) can be employed for the selective removal of the SiGe sacrificial layers relative to the Si active layers.

Further, high germanium (Ge) content SiGe can be selectively removed relative to low Ge content SiGe using an etchant such as dry HCL. Thus, according to an exemplary embodiment, the sacrificial layer 206 is formed from SiGe having a high Ge content, whereas each of the sacrificial layers 208, 208', 208'', 208''', etc. is formed from SiGe having a low Ge content. By way of example only, SiGe having a high Ge content is considered herein to be SiGe having from about 50% Ge to about 100% Ge (i.e., pure Ge) and ranges therebetween. For instance, in one non-limiting example, the sacrificial layer 206 is formed from SiGe60 (which is SiGe having a Ge content of about 60%). By contrast, SiGe having a low Ge content is considered herein to be SiGe having from about 20% Ge to about 50% Ge and ranges therebetween. For instance, in one non-limiting example, each of the sacrificial layers 208, 208', 208'', 208''', etc. is formed from SiGe30 (which is SiGe having a Ge content of about 30%). This configuration will enable the sacrificial layer 206 to be selectively removed relative to the sacrificial layers 208, 208', 208'', 208''', etc. during formation of the bottom dielectric isolation layer (see below).

As highlighted above, the stack 204 is then patterned. Patterning of the stack 204 will enable shallow trench isolation (STI) regions to be formed in the substrate 202 at the base of the NFET and PFET stacks. Standard lithography and etching techniques can be employed to pattern the stack 204. With standard lithography and etching processes, a lithographic stack (not shown), e.g., photoresist/anti-reflective coating (ARC)/organic planarizing layer (OPL), is used to pattern a hardmask 212 on the stack 204. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, the hardmask 212 can be formed by other suitable techniques, including but not limited to, sidewall image transfer (SIT), self-aligned double patterning (SADP), self-aligned quadruple patterning (SAQP), and other self-aligned multiple patterning (SAMP).

An etch is then used to transfer the pattern from the hardmask 212 to the sacrificial and active layers of the stack 204 and partway through the underlying substrate 202. A directional (anisotropic) etching process such as reactive ion etching (RIE) can be employed for the stack 204/substrate 202 etch. As shown in FIG. 2B, trenches 214 are now present in the substrate 202 at a base of the (patterned) stack 204.

An NFET-to-PFET space 304 is then opened in the stack 204. See FIG. 3A (an X-X' cross-sectional view) and FIG. 3B (a Y1-Y1' and Y2-Y2' cross-sectional view). To do so, a patterned block mask 302 can first be formed on the stack 204. An etch can then be used to transfer the pattern from the block mask 302 to the hardmask 212 and underlying stack 204, forming the NFET-to-PFET space 304 in the stack 204. Suitable materials for the block mask 302 include, but are not limited to, organic planarizing layer (OPL) materials which can be deposited onto the stack 204 using a casting process such as spin-on coating or spray coating, chemical vapor deposition (CVD), atomic layer deposition (ALD) or physical vapor deposition (PVD). Standard lithography and etching techniques (see above) can be employed to pattern the block mask 302.

A directional (anisotropic) etching process such as RIE can be employed for the NFET-to-PFET space 304 etch. The NFET-to-PFET space 304 divides the stack 204 into at least one NFET device stack 204N and at least one PFET device stack 204P. As shown in FIG. 3B, the NFET device stack 204N and the PFET device stack 204P are separated from one another by the NFET-to-PFET space 304. It is notable that the process depicted in FIGS. 3A and 3B is merely one illustrative, non-limiting embodiment contemplated herein for forming the NFET-to-PFET space 304. Namely, in accordance with the present techniques, the NFET-to-PFET space 304 can be formed using any other suitable lithography or similar patterning process.

A sacrificial material is then deposited into, and filling the NFET-to-PFET space 304 forming a sacrificial pillar 402 separating the NFET device stack 204N and the PFET device stack 204P, after which the block mask 302 is removed and STI regions 404 are formed in the trenches 214 at the base of the NFET/PFET device stacks 204N/204P. See FIG. 4 (a Y1-Y1' and Y2-Y2' cross-sectional view). Suitable sacrificial materials for the sacrificial pillar 402 include, but are not limited to, aluminum oxide (AlOx), silicon carbide (SiC) and/or titanium oxide (TiOx), which can be deposited into the NFET-to-PFET space 304 using a process such as CVD, ALD or PVD. Following deposition, an etch back of the sacrificial material can be performed using a plasma dry etch process. As provided above, the block mask 302 can be formed from an OPL material. In that case, the block mask 302 can be removed using an ashing process.

According to an exemplary embodiment, STI regions 404 are formed by filling trenches 214 with a dielectric material such as an oxide material (also referred to herein generally as an 'STI oxide') and then recessing the STI oxide. Although not explicitly shown in the figures, a liner (e.g., a thermal oxide or silicon nitride (SiN)) may be deposited into the trenches 214 prior to the STI oxide. Suitable STI oxides include, but are not limited to, silicon oxide (SiOx). A process such as CVD, ALD, or PVD can be employed to deposit the STI oxide into the trenches 214. Following deposition, an oxide-selective etch can then be used to recess the STI oxide.

The hardmask 212 is then removed, sacrificial gates 504 are formed over the NFET and PFET device stacks 204N and 204P, and the sacrificial layer 206 is removed forming a cavity 506 below the NFET and PFET device stacks 204N and 204P. See FIG. 5A (an X-X' cross-sectional view), FIG. 5B (a Y1-Y1' cross-sectional view) and FIG. 5C (a Y2-Y2' cross-sectional view).

To form the sacrificial gates 504, a sacrificial material is first blanket deposited over the NFET and PFET device stacks 204N and 204P. Suitable sacrificial materials include, but are not limited to, poly-silicon (poly-Si) and/or amorphous silicon (a-Si), which can be deposited using a process such as CVD, ALD or PVD. Although not shown in the figures, a thin (e.g., from about 1 nanometer (nm) to about 5 nm) layer of silicon oxide (SiOx) is preferably first formed on the NFET and PFET device stacks 204N and 204P, followed by deposition of the poly-Si and/or a-Si.

Standard lithography and etching techniques (see above) are then used to pattern sacrificial gate hardmasks 502 on the sacrificial material marking the footprint and location of each of the sacrificial gates 504. Suitable materials for the sacrificial gate hardmasks 502 include, but are not limited to, nitride hardmask materials such as SiN, SiON and/or silicon carbide nitride (SiCN), and/or oxide hardmask materials such as SiOx. Alternatively, the sacrificial gate hardmasks 502 can be formed by other suitable techniques, including but not limited to, SIT, SADP, SAQP, and other SAMP. An etch is then used to transfer the pattern from the sacrificial gate hardmasks 502 to the sacrificial material, forming the individual sacrificial gates 504. A directional (anisotropic) etching process such as RIE can be employed for the sacrificial gate etch.

As highlighted above, sacrificial gates 504 will be removed later on in the process and replaced with replacement gates that will serve as the final gates of the fork sheet FET device. This is referred to as a 'gate-last' approach since the replacement gates are formed last, near the end of the process. Use of a gate-last approach is advantageous because it prevents exposure of the metal gate stack materials to potentially damaging conditions during subsequent processing steps. For instance, the high-κ dielectrics used in the replacement gates can become damaged by exposure to high temperatures during formation of the source/drain regions. Thus, with this scheme, the metal gate stack materials are only placed near the end of the process.

A bottom dielectric isolation layer will be formed in the cavity 506 below the NFET and PFET device stacks 204N and 204P (see below). The bottom dielectric isolation layer will serve to prevent source/drain region leakage through the substrate 202. Cavity 506 is formed by the selective removal of the sacrificial layer 206. As provided above, sacrificial layer 206 can be formed from high Ge content SiGe (e.g., SiGe having from about 50% Ge to about 100% Ge (i.e., pure Ge) and ranges therebetween, such as SiGe60). In that case, an etchant such as dry HCl can be used to selectively remove the sacrificial layer 206 to form the cavity 506.

A dielectric spacer material is deposited over the sacrificial gates 504 and into/filling the cavity 506, followed by a directional (anisotropic) etching process such as RIE that is used to pattern the dielectric spacer material into a bottom dielectric isolation layer 602 in the cavity 506 and gate spacers 604 alongside the sacrificial gate hardmasks 502/sacrificial gates 504. See FIG. 6A (an X-X' cross-sectional view), FIG. 6B (a Y1-Y1' cross-sectional view) and FIG. 6C (a Y2-Y2' cross-sectional view). Suitable dielectric spacer materials include, but are not limited to, SiOx, SiC, silicon oxycarbide (SiCO) and/or SiN, which can be deposited using a process such as CVD, ALD or PVD.

The sacrificial gate hardmasks 502/sacrificial gates 504 and gate spacers 604 are then used as a mask to pattern trenches 702 in the NFET and PFET device stacks 204N and 204P in between the sacrificial gates 504. See FIG. 7A (an X-X' cross-sectional view) and FIG. 7B (a Y1-Y1' cross-sectional view). A directional (anisotropic) etching process such as RIE can be employed for the trench etch. As shown in FIGS. 7A and 7B, the trenches 702 extend through each of the sacrificial layers 208, 208', 208", 208'", etc. and active layers 210, 210', 210", etc., stopping on the bottom dielectric isolation layer 602.

Next, inner spacers 802 are first formed alongside the sacrificial layers 208, 208', 208", 208'", etc., after which NFET and PFET source/drain regions 804 and 806 are formed in the trenches 702 on opposite sides of the sacrificial gates 504 alongside the sacrificial layers 208, 208', 208", 208'", etc. and active layers 210, 210', 210", etc. in the NFET and PFET device stacks 204N and 204P, respectively. See FIG. 8A (an X-X' cross-sectional view) and FIG. 8B (a Y1-Y1' cross-sectional view). To form the inner spacers 802, a selective lateral etch is performed to recess the sacrificial layers 208, 208', 208", 208'", etc. exposed along the sidewalls of trenches 702. As shown in FIG. 8A, this recess etch forms pockets along the sidewalls of the trenches 702 that are then filled with a spacer material to form the inner spacers 802 within the pockets. These inner spacers 802 will serve to offset the replacement gates from the NFET/PFET source/drain regions 804/806 (see below).

As provided above, sacrificial layers 208, 208', 208", 208'", etc. can be formed from SiGe. In that case, a SiGe-selective non-directional (isotropic) etching process such as a wet chemical etch or gas phase etch can be employed for the recess etch to form the pockets. Suitable materials for the inner spacers 802 include, but are not limited to, SiN, SiOx, SiC and/or SiCO, which can be deposited into the pockets using a process such as CVD, ALD or PVD. Following deposition, excess inner spacer material can be removed from the trenches 702 using an isotropic etching process such as wet etch or selective dry etch.

According to an exemplary embodiment, the NFET/PFET source/drain regions 804/806 are formed from an in-situ doped (i.e., where dopants are introduced during growth) or ex-situ doped (e.g., where dopants are introduced via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B). It is notable that, with the inner spacers 802 in place along the sidewalls of the trenches 702, epitaxial growth of the NFET/PFET source/drain regions 804/806 is templated only from the ends of the active layers 210, 210', 210", etc. in the NFET/PFET device stacks 204N/204P exposed along the sidewalls of the trenches 702. As shown in FIGS. 8A and 8B, the NFET/PFET source/drain regions 804/806 are separated from the substrate 202 by the bottom dielectric isolation layer 602.

As shown in FIG. 8B, the NFET/PFET source/drain regions 804/806 are disposed on opposite sides of the sacrificial pillar 402. However, the sacrificial pillar 402 is taller than the NFET/PFET source/drain regions 804/806, such that the NFET/PFET source/drain regions 804/806 are present alongside a bottom portion 810 of the sacrificial pillar 402, and a top portion 812 of the sacrificial pillar 402 above the NFET/PFET source/drain regions 804/806 is exposed. To look at it another way, the NFET/PFET source/drain regions 804/806 are not present alongside that top portion 812 of the sacrificial pillar 402.

The top portion 812 of the sacrificial pillar 402 that is exposed above the NFET/PFET source/drain regions 804/806 is next trimmed. See FIG. 9 (a Y1-Y1' cross-sectional view). The (trimmed) top portion of the sacrificial pillar 402 is now given the reference numeral 812a. A non-directional (i.e., isotropic) etching process such as a wet chemical etch or gas phase etch can be employed to trim the top portion 812a of the sacrificial pillar 402. Trimming the top portion 812a of the sacrificial pillar 402 reduces its width, i.e., relative to the bottom portion 810 of the sacrificial pillar 402. Namely, as shown in FIG. 9, the bottom portion 810 of the sacrificial pillar 402 has a width $W1_{SACRIFICIAL\ PILLAR}$ and the (trimmed) top portion 812a of the sacrificial pillar 402 has a width $W2_{SACRIFICIAL\ PILLAR}$, whereby $W2_{SACRIFICIAL\ PILLAR}$ is less than $W1_{SACRIFICIAL\ PILLAR}$, i.e., $W2_{SACRIFICIAL\ PILLAR} < W1_{SACRIFICIAL\ PILLAR}$. As will be described in detail below, this trimming of the sacrificial pillar 402 in this manner will advantageously enable a replacement spacer to be formed in its place containing an airgap. More specifically, the trimmed top portion 812a of the sacrificial pillar 402 serves to create a bottle neck that gets pinched off before the underlying space can be fully filled, thereby creating an airgap. It is notable that, during the trimming, there may be some minimal loss in height of the top portion 812a of the sacrificial pillar 402. This effect is, however, inconsequential. Further, the trimming of the sacrificial pillar 402 at this stage occurs between the NFET/PFET source/drain regions 804/806, thereby enabling the present airgap pillar to be formed between the NFET/PFET source/drain regions 804/806. As will be described in detail below, a trimming of the sacrificial pillar 402 (presently under the sacrificial gates 504) will also be undertaken to enable formation of the present airgap pillar between the NFET/PFET gates as well.

An interlayer dielectric (ILD) 1002 is then deposited over, and burying, the NFET/PFET device stacks 204N/204P (and sacrificial pillar 402 therebetween), sacrificial gates 504 and gate spacers 604, and the NFET/PFET source/drain regions 804/806. See FIG. 10A (an X-X' cross-sectional view), FIG. 10B (a Y1-Y1' cross-sectional view) and FIG. 10C (a Y2-Y2' cross-sectional view). Suitable ILD 1002 materials include, but are not limited to, oxide low-κ materials such as SiOx and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ULK-ILD materials include, but are not limited to, porous organosilicate glass (pSiCOH). A process such as CVD, ALD, or PVD can be employed to deposit the ILD 1002. Following deposition, the ILD 1002 can be polished using a process such as chemical mechanical polishing (CMP). According to an exemplary embodiment, the ILD 1002 is polished down to the sacrificial gates 504, removing the sacrificial gate hardmasks 502. Doing so will enable the sacrificial gates 504 to be selectively removed relative to the ILD 1002 for replacement by the gates (see below).

As highlighted above, a trimming of the sacrificial pillar 402 between the NFET/PFET gates is also conducted. Since this portion of the sacrificial pillar 402 is presently under the sacrificial gates 504, a partial recess of the sacrificial gates 504 is first performed to expose the top portion 812 of the sacrificial pillar 402 in this region. See FIG. 11A (an X-X' cross-sectional view) and FIG. 11B (a Y2-Y2' cross-sectional view). A selective etching process such as RIE can be employed for the recess etch of the sacrificial gates 504. As shown in FIGS. 11A and 11B, by only partially recessing the sacrificial gates 504 the underlying NFET and PFET device stacks 204N and 204P will remain covered and thus protected during the trimming of the sacrificial pillar 402.

As shown in FIG. 11B, the NFET and PFET device stacks 204N and 204P are disposed on opposite sides of the sacrificial pillar 402. However, the sacrificial pillar 402 is taller than the NFET and PFET device stacks 204N and 204P, such that the NFET and PFET device stacks 204N and 204P are present alongside the bottom portion 810 of the sacrificial pillar 402, and the top portion 812 of the sacrificial pillar 402 above the NFET and PFET device stacks 204N and 204P is exposed. To look at it another way, the NFET and PFET device stacks 204N and 204P are not present alongside that top portion 812 of the sacrificial pillar 402.

The top portion 812 of the sacrificial pillar 402 that is exposed above the NFET and PFET device stacks 204N and 204P is next trimmed. See FIG. 12 (a Y2-Y2' cross-sectional view). As above, the (trimmed) top portion of the sacrificial pillar 402 is given the reference numeral 812a. A non-directional (i.e., isotropic) etching process such as a wet chemical etch or gas phase etch can be employed to trim the top portion 812a of the sacrificial pillar 402. In the same manner as described above, trimming the top portion 812a of the sacrificial pillar 402 reduces its width, i.e., relative to the bottom portion 810 of the sacrificial pillar 402. Namely, as shown in FIG. 12, the bottom portion 810 of the sacrificial pillar 402 has the width $W1_{SACRIFICIAL\ PILLAR}$ and the (trimmed) top portion 812a of the sacrificial pillar 402 has the width $W2_{SACRIFICIAL\ PILLAR}$, whereby W2' is less than $W1_{SACRIFICIAL\ PILLAR}$, i.e., $W2_{SACRIFICIAL\ PILLAR} < W1_{SACRIFICIAL\ PILLAR}$. As will be described in detail below, this trimming of the sacrificial pillar 402 in this manner will advantageously enable a replacement spacer to be formed in its place containing an airgap by creating a bottle neck that gets pinched off before the underlying space can be fully filled. It is notable that, during the trimming, there may be some minimal loss in height of the top portion 812a of the sacrificial pillar 402. This effect is, however, inconsequential. The top portion 812a of the sacrificial pillar 402 has now been trimmed in both the source/drain region of the fork sheet FET device (i.e., between the NFET/PFET source/drain regions 804/806) and in the gate region of the fork sheet FET device (i.e., between the NFET and PFET device stacks 204N and 204P) which, as highlighted above, will advantageously enable formation of the present airgap pillar between the NFET/PFET source/drain regions 804/806 and between the NFET/PFET gates.

The remainder of the sacrificial gates 504 is then selectively removed forming gate trenches 1302 in the ILD 1002 over the NFET and PFET device stacks 204N and 204P in between the NFET/PFET source/drain regions 804/806, respectively. See FIG. 13A (an X-X' cross-sectional view) and FIG. 13B (a Y2-Y2' cross-sectional view). As shown in FIGS. 13A and 13B, the sacrificial layers 208, 208', 208'', 208''', etc., now accessible through the gate trenches 1302, are also removed. Removal of the sacrificial layers 208, 208', 208'', 208''', etc. releases the active layers 210, 210', 210'', etc. from the NFET and PFET device stacks 204N and 204P. Gaps 1304 are now present in the NFET and PFET device stacks 204N and 204P in between the active layers 210, 210', 210'', etc. The active layers 210, 210', 210'', etc. will serve as the channels of the fork sheet FET device. Releasing the active layers 210, 210', 210'', etc. from the NFET and PFET device stacks 204N and 204P will enable the replacement gates to be formed surrounding at least a portion of the channels (i.e., active layers 210, 210', 210'', etc.) in a gate-all-around or GAA configuration.

Replacement gates 1402 are then formed in the gate trenches 1302 and gaps 1304. See FIG. 14A (an X-X' cross-sectional view) and FIG. 14B (a Y2-Y2' cross-sectional view). As shown in magnified view 1404, according to an exemplary embodiment, each of the replacement gates 1402 includes a gate dielectric 1408 and a gate conductor 1410 disposed on the gate dielectric 1408. Although not explicitly shown in the figures, a thin (e.g., from about 0.3 nm to about 5 nm) interfacial oxide (e.g., silicon oxide (SiOx) which may include other chemical elements in it such as nitrogen (N), germanium (Ge), etc.) can first be formed on exposed surfaces of the active layers 210, 210', 210'', etc., and the gate dielectric 1408 can then be deposited over the interfacial oxide using a process such as CVD, ALD, or PVD.

Suitable materials for the gate dielectric 1408 include, but are not limited to, silicon oxide (SiOx), SiN, silicon oxynitride (SiOxNy), high-κ materials, or any combination thereof. The term "high-κ" as used herein refers to a material having a relative dielectric constant κ which is much higher than that of silicon dioxide (e.g., a dielectric constant κ is about 25 for hafnium oxide ($HfO_2$) rather than 3.9 for $SiO_2$). Suitable high-κ materials include, but are not limited to, metal oxides such as $HfO_2$, hafnium silicon oxide (HfSiO), hafnium silicon oxynitride (HfSiO), lanthanum oxide ($La_2O_3$), lanthanum aluminum oxide ($LaAlO_3$), zirconium oxide ($ZrO_2$), zirconium silicon oxide ($ZrSiO_4$), zirconium silicon oxynitride (ZrSiOxNy), tantalum oxide (TaOx), titanium oxide (TiO), barium strontium titanium oxide ($BaO_6SrTi_2$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$) and/or lead zinc niobite (Pb(Zn,Nb)O). The high-κ material can further include dopants such as lanthanum (La), aluminum (Al) and/or magnesium (Mg). The gate dielectric 1408 can be deposited using a process or combination of processes such as, but not limited to, thermal oxidation, chemical oxidation, thermal nitridation, plasma oxidation, plasma nitridation, CVD, ALD, etc. According to an exemplary embodiment, the gate dielectric 1408 has a thickness of from about 1 nm to about 5 nm and ranges therebetween.

Suitable materials for the gate conductor 1410 include, but are not limited to, doped polysilicon and/or at least one workfunction-setting metal. Suitable workfunction-setting metals include, but are not limited to, titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN), titanium carbide (TiC) titanium aluminum carbide (TiAlC), tantalum carbide (TaC) and/or hafnium carbide (HfC). The gate conductor 1410 can be deposited using a process or combination of processes such as, but not limited to, CVD, ALD, PVD, sputtering, plating, evaporation, ion beam deposition, electron beam deposition, laser assisted deposition, chemical solution deposition, etc. According to an exemplary embodiment, the gate conductor 1410 has a thickness of from about 5 nm to about 15 nm and ranges therebetween. In the exemplary embodiment shown illustrated in FIGS. 14A and 14B, the gate conductor 1410 includes at least one layer 1410a of the above workfunction-setting metal(s) and a (low-resistance) fill metal 1410b disposed over the layer(s) 1410a of workfunction-setting metal(s) so as to fill in any remaining space in the replacement gates 1402. Suitable low-resistance fill metals include, but are not limited to, tungsten (W) and/or aluminum (Al) which can be deposited using a process or combination of processes such as, but not limited to, CVD, ALD, PVD, sputtering, plating, evaporation, ion beam deposition, electron beam deposition, laser assisted deposition, chemical solution deposition, etc. As shown in FIGS. 14A and 14B, the replacement gates 1402, i.e., gate dielectric 1408 and gate conductor 1410, fully surround at least a portion of each of the active layers 210, 210', 210", etc. in a gate-all-around configuration.

The replacement gates 1402, i.e., gate dielectric 1408 and gate conductor 1410, are then recessed and dielectric caps 1502 are formed over the (recessed) replacement gates 1402. See FIG. 15A (an X-X' cross-sectional view), FIG. 15B (a Y1-Y1' cross-sectional view) and FIG. 15C (a Y2-Y2' cross-sectional view). Suitable dielectric cap materials include, but are not limited to, SiOx and/or SiN, which can be deposited using a process such as CVD, ALD or PVD. Following deposition, the dielectric cap material can be planarized using a process such as CMP. As shown in FIG. 15B, the ILD 1002 is also recessed during polishing of the dielectric caps 1502, thereby exposing a top of the sacrificial pillar 402 in the source/drain region of the fork sheet FET device. As shown in FIG. 15C, the polishing of the dielectric caps 1502 also exposes the top of the sacrificial pillar 402 in the gate region of the fork sheet FET device. Exposing the top of the sacrificial pillar 402 will enable the sacrificial pillar 402 to be selectively removed and replaced with the (replacement) airgap pillar.

Namely, the sacrificial pillar 402 is next selectively removed, forming an opening 1602 in between the NFET and PFET source/drain regions 804 and 806 in the source/drain region of the fork sheet FET device, and in between the replacement gates 1402 over the NFET and PFET device stacks 204N and 204P in the gate region of the fork sheet FET device. See FIG. 16A (a Y1-Y1' cross-sectional view) and FIG. 16B (a Y2-Y2' cross-sectional view). Based on the above-described process, the opening 1602 formed by removal of the sacrificial pillar 402 has a unique shape. Namely, by trimming the top portion of the sacrificial pillar 402 as described above, a bottom portion 1604 of the opening 1602 has a width $W1_{OPENING}$ and a top portion 1606 of the opening 1602 has a width $W2_{OPENING}$, whereby $W2_{OPENING}$ is less than $W1_{OPENING}$, i.e., $W2_{OPENING} < W1_{OPENING}$. This configuration of having a narrow top through which the opening 1602 will be filled, serves to create a bottle neck for the filling process that gets pinched off before the bottom portion 1604 of the opening 1602 can be fully filled, thereby creating an airgap.

Figure 17A:
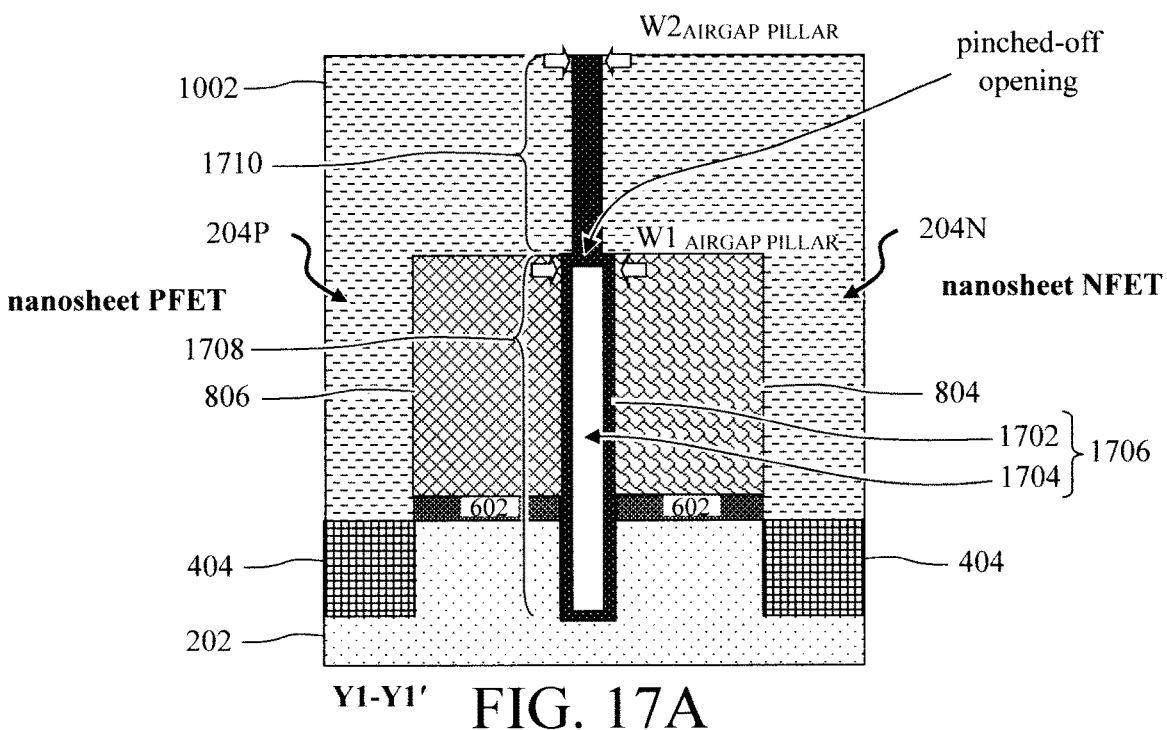
FIG. 17A is a Y1-Y1' cross-sectional view illustrating a conformal dielectric liner having been deposited into and lining the opening to form a dielectric airgap pillar.
Figure 17B:
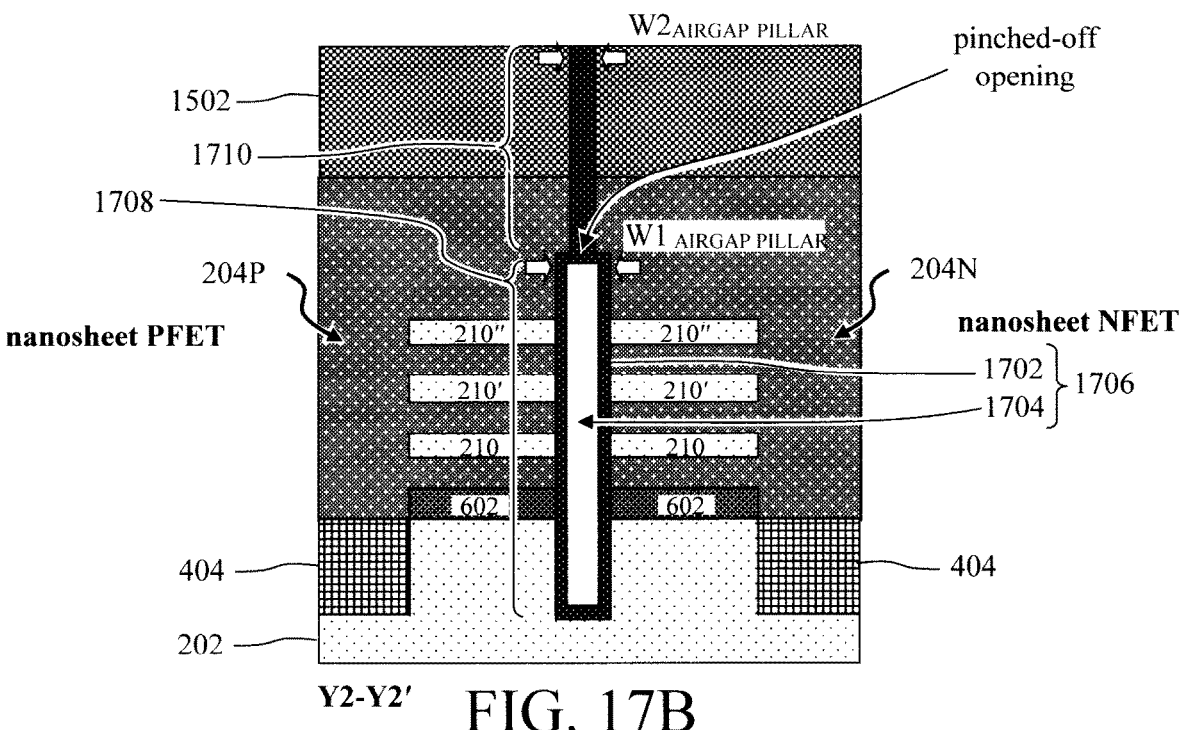
FIG. 17B is a Y2-Y2' cross-sectional view illustrating the conformal dielectric liner having been deposited into and lining the opening to form a dielectric airgap pillar according to an embodiment of the present invention.

For instance, a conformal dielectric liner 1702 is next deposited into and lining the opening 1602. See FIG. 17A (a Y1-Y1' cross-sectional view) and FIG. 17B (a Y2-Y2' cross-sectional view). Based on the narrowed inlet at the top portion 1606 of the opening 1602, though which the conformal dielectric liner 1702 is being deposited, the top portion 1606 of the opening 1602 will become pinched off before the bottom portion 1604 of the opening 1602 is fully filled by the dielectric liner 1702. As shown in FIGS. 17A and 17B, the dielectric liner 1702 deposited in this manner will line the bottom portion 1604 of the opening 1602, and fully surrounding an airgap 1704 at the center the bottom portion 1604 of the opening 1602 which is the present dielectric airgap pillar 1706. Suitable materials for the dielectric liner 1702 include, but are not limited to, SiOx, SiN, SiON and/or SiCN, which can be deposited into the opening 1602 using a process such as CVD, ALD or PVD. Following deposition, excess material can be removed using a process such as CMP.

As shown in FIGS. 17A and 17B, based on the unique shape of opening 1602, a bottom portion 1708 of the dielectric airgap pillar 1706 has a width $W1_{AIRGAP\ PILLAR}$ and a top portion 1710 of the dielectric airgap pillar 1706 has a width $W2_{AIRGAP\ PILLAR}$, whereby $W2_{AIRGAP\ PILLAR}$ is less than $W1_{AIRGAP\ PILLAR}$, i.e., $W2_{AIRGAP\ PILLAR} < W1_{AIRGAP\ PILLAR}$. The dielectric airgap pillar 1706 is disposed directly between the NFET and PFET nanosheet devices shown, in this particular example, to the right and to the left of the dielectric airgap pillar 1706, respectively. The nanosheets (i.e., active layers 210, 210', 210", etc.) of the NFET and PFET nanosheet devices extend horizontally on opposite sides of the dielectric airgap pillar 1706.

Specifically, as shown in FIG. 17A, the dielectric airgap pillar 1706 directly contacts, and separates the NFET and PFET source/drain regions 804 and 806 in the source/drain region of the fork sheet FET device. As shown in FIG. 17B, the dielectric airgap pillar 1706 directly contacts, and separates the replacement gates 1402 over the NFET and PFET device stacks 204N and 204P (also referred to herein as 'the NFET gates and PFET gates,' respectively) in the gate region of the fork sheet FET device. As provided above, implementing the dielectric airgap pillar 1706 in this manner between the NFET and PFET devices greatly reduces capacitance coupling in the present fork sheet FET design.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A fork sheet field-effect transistor (FET) device, comprising:

at least a first nanosheet FET and a second nanosheet FET, wherein the first nanosheet FET comprises an n-channel FET (NFET) and the second nanosheet FET comprises a p-channel FET (PFET); and a dielectric pillar disposed directly between the first nanosheet FET and the second nanosheet FET, wherein the dielectric pillar is an airgap pillar and wherein the dielectric pillar is a vertical continuous and hollow structure further comprising:

a top portion of the dielectric pillar;

a bottom portion of the dielectric pillar embedded into a substrate; and a continuous and uninterrupted vertical wall connecting the top portion of the dielectric pillar to the bottom portion of the dielectric pillar by forming a right angle at an intersection between the top portion of the dielectric pillar and the bottom portion of the dielectric pillar and wherein the bottom portion of the dielectric pillar has a width W1 and the top portion of an opening has a width W2 and wherein W2<W1.

2. The fork sheet FET of claim 1, wherein the substrate comprises a semiconductor-on-insulator (SOI) wafer that includes a SOI layer separated from an underlying substrate by a buried insulator.

3. The fork sheet FET of claim 1, wherein the first nanosheet FET and a second nanosheet FET contact opposite sides of the dielectric pillar.

4. The fork sheet FET of claim 1, wherein the dielectric pillar separates a gate of the first nanosheet FET from a gate of the second nanosheet FET.

5. The fork sheet FET of claim 1, wherein the dielectric pillar separates a source/drain region of the first nanosheet FET from a source/drain region of the second nanosheet FET.

6. The fork sheet FET of claim 1, wherein the dielectric pillar comprises a liner fully surrounding the airgap pillar.

7. The fork sheet FET of claim 6, wherein the liner comprises a material selected from a group consisting of: silicon oxide (SiOx), silicon nitride (SiN), silicon oxynitride (SiON), silicon carbide nitride (SiCN), and combinations thereof.

8. A fork sheet field-effect transistor (FET) device, comprising:

at least a first nanosheet FET and a second nanosheet FET; and a dielectric pillar disposed directly between the first nanosheet FET and the second nanosheet FET, wherein the dielectric pillar is an airgap pillar, and wherein the first nanosheet FET and the second nanosheet FET comprise nanosheets that extend horizontally on opposite sides of the dielectric pillar, wherein the dielectric pillar is a vertical and hollow structure further comprising:

a top portion of the dielectric pillar;

a bottom portion of the dielectric pillar embedded into a substrate; and a continuous and uninterrupted vertical wall connecting the top portion of the dielectric pillar to the bottom portion of the dielectric pillar by forming a right angle at an intersection between the top portion of the dielectric pillar and the bottom portion of the dielectric pillar and wherein the bottom portion of the dielectric pillar has a width W1 and the top portion of an opening has a width W2 and wherein W2<W1.

9. The fork sheet FET of claim 8, wherein the dielectric pillar comprises a liner fully surrounding the airgap pillar, wherein the liner comprises a material selected from a group consisting of: silicon oxide (SiOx), silicon nitride (SiN), silicon oxynitride (SiON), silicon carbide nitride (SiCN), and combinations thereof.

10. The fork sheet FET of claim 8, wherein the dielectric pillar separates a gate of the first nanosheet FET from a gate of the second nanosheet FET.

11. The fork sheet FET of claim 8, wherein the dielectric pillar separates a source/drain region of the first nanosheet FET from a source/drain region of the second nanosheet FET.

* * * * *